United States Patent
Yamasaki

(10) Patent No.: US 9,130,023 B2
(45) Date of Patent: Sep. 8, 2015

(54) ISOLATED INSULATING GATE STRUCTURE

(75) Inventor: Hiroyuki Yamasaki, Mamaronek, NY (US)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/488,894

(22) Filed: Jun. 5, 2012

(65) Prior Publication Data

US 2013/0320412 A1  Dec. 5, 2013

(51) Int. Cl.
  *H01L 29/76*  (2006.01)
  *H01L 21/768*  (2006.01)
  *H01L 21/28*  (2006.01)
  *H01L 29/66*  (2006.01)
  *H01L 21/8238*  (2006.01)
  *H01L 21/321*  (2006.01)

(52) U.S. Cl.
  CPC .... *H01L 21/76897* (2013.01); *H01L 21/28247* (2013.01); *H01L 21/321* (2013.01); *H01L 21/76814* (2013.01); *H01L 21/823842* (2013.01); *H01L 21/823857* (2013.01); *H01L 29/66545* (2013.01); *H01L 21/76831* (2013.01)

(58) Field of Classification Search
  CPC ............... H01L 2924/0002; H01L 2924/00; H01L 2924/00014; H01L 29/78; H01L 27/11582

USPC .......................................................... 257/288
See application file for complete search history.

(56) References Cited

U.S. PATENT DOCUMENTS

2013/0178033 A1* 7/2013 Bohr et al. ..................... 438/299
2013/0200471 A1* 8/2013 Labonte et al. ............... 257/409

FOREIGN PATENT DOCUMENTS

JP  2010-028004  2/2010
JP  2010-028004  * 4/2010

* cited by examiner

*Primary Examiner* — Tony Tran
(74) *Attorney, Agent, or Firm* — White & Case LLP

(57) ABSTRACT

Systems and methods are presented for forming a gate structure comprising an insulative portion, whereby the insulative portion is utilized to electrically isolate an electrically conductive portion of the gate structure from a conductive element located in the vicinity of the gate structure. The insulative portion is formed by chemically modifying a conductive portion of the gate. Chemical modification is an oxidation process, converting aluminum conductor to aluminum oxide insulator material. Utilizing a chemically modified gate structure enables self aligning contact technique(s) to be utilized with semiconductor devices comprising a replacement metal gate(s). The chemical modification process can be performed prior or after forming a contact opening.

10 Claims, 21 Drawing Sheets

US 9,130,023 B2

ISOLATED INSULATING GATE STRUCTURE

FIELD

Embodiments described herein relate generally to methods and systems for production of a gate structure(s) comprising an isolation region to minimize electrically deleterious effects in semiconductor devices.

BACKGROUND

Silicon large-scale integrated circuits, among other device technologies, are applied ubiquitously throughout modern society to accommodate the needs for digital information and digital control. An integrated circuit may be composed of a plurality of semiconductor devices, such as transistors or the like, which can be produced according to a variety of techniques. To facilitate increased integration and speed of semiconductor devices, a trend of continuously scaling semiconductors (e.g., reducing size and features of semiconductor devices) has emerged. Reducing semiconductor and/or semiconductor feature size provides improved speed, performance, density, cost per unit, etc., of resultant integrated circuits. However, as semiconductor devices and device features have become smaller, conventional fabrication techniques have become limited in their ability to produce finely defined features.

A particular development in the range of semiconductor devices are field effect transistors (FETs) where metal oxide semiconductor field effect transistors (MOSFET or MOS) and complimentary metal oxide semiconductor (CMOS) can utilize both p-type and n-type (PMOS and NMOS) transistors in conjunction with a gate structure(s). Of particular concern is the increased likelihood of a shortage occurring across a gate and a proximately located conductive element, such as a contact.

FIG. 49 illustrates an ideal scenario (continuous bold line) where a contact 950 (e.g., connecting with a trench silicide 920 forming a source/drain) is ideally located between replacement metal gate (RMG) structures 910*a* and 910*b*. In an embodiment, contact 950 may comprise of a self aligned contact (SAC), however such technology may not be amenable to RMG structures owing to the degree of positional tolerancing (±q) required that can be inherent to self aligned structure technology. A constraint regarding how far critical dimensioning can be reduced is where consideration has to be made with regard to the distance between a pair of structures when a subsequent structure is to be placed between the pair of structures. Further, as the distance between respective RMGs in a semiconductor device is reduced, as a function of scaling, the ability to accurately locate a contact, whether it be self aligning or otherwise, becomes difficult. For example, a pair of FET gates (e.g., gates 910*a* and 910*b*, which can be any combination pairing comprising a pair of nFET gates or a pair of pFET gates) are separated by a source/drain region (e.g., source/drain 920), where, in a subsequent operation, a contact has to be formed to connect with the source/drain region while not coming into contact with either of the FET gates 910*a* or 910*b*.

For example, FIG. 50 illustrates an undesirable arrangement where contact 960 has been erroneously located and gate shortage can occur along electrical pathway S1. In another example, as illustrated in FIG. 51, even with the approach of utilizing a metal line 970 having a tapered profile, and while the metal line is located on source/drain region 920, the distance S2 between the gate 910*a* and the interconnect 970 may be of such a short distance that current leakage can occur at S2.

Hence, as shown in FIGS. 50 and 51, owing to the diminished sizes with which semiconductor devices are being manufactured, the ability to accurately locate contact(s) with respect to other device features (e.g., RMGs) is being tested. Hence, while technologies facilitate further miniaturization of semiconductor related devices and components, issues regarding construction of the devices (e.g., gate formation, surface profiles, etc.) are still to be addressed.

SUMMARY

A simplified summary is provided herein to help enable a basic or general understanding of various aspects of exemplary, non-limiting embodiments that follow in the more detailed description and the accompanying drawings. This summary is not intended, however, as an extensive or exhaustive overview. Instead, the sole purpose of this summary is to present some concepts related to some exemplary non-limiting embodiments in a simplified form as a prelude to the more detailed description of the various embodiments that follow.

The subject innovation presents various techniques relating to the formation of a gate structure comprising an insulative portion, whereby the insulative portion is utilized to electrically isolate an electrically conductive portion of the gate structure from a conductive element located in the vicinity of the gate structure.

The various exemplary, non-limiting embodiments presented herein, in effect, utilize chemical modification of a portion of the material comprising the gate from a conductive state to a non-conductive state. Such conductive material can be a metallic element which when oxidized forms a non-metallic element having electrically insulating properties. In an embodiment, the metallic element is aluminum and the non-metallic element is aluminum oxide. In an embodiment, the chemical modification can occur during construction of the gate. In another embodiment, the chemical modification can occur as part of a sequence involving creation of a contact opening.

By modifying a portion of a gate structure to comprise of insulator it is possible to reduce the critical dimensioning of a semiconductor. In an embodiment, rather than having to accurately locate a contact between two gates while preventing electrical contact with either of the gates, the contact opening can be formed such that the insulative portion of the gate is exposed and the subsequently formed contact locates in part on the insulative portion. Hence, rather than having to accurately position the contact opening with respect to the two gates, a greater degree of positioning tolerance can be utilized. Further, owing to the greater degree of positioning tolerance, the various embodiments presented herein are amenable to utilization with a contact formed by a self aligning technique.

DETAILED DESCRIPTION

Figure 50:
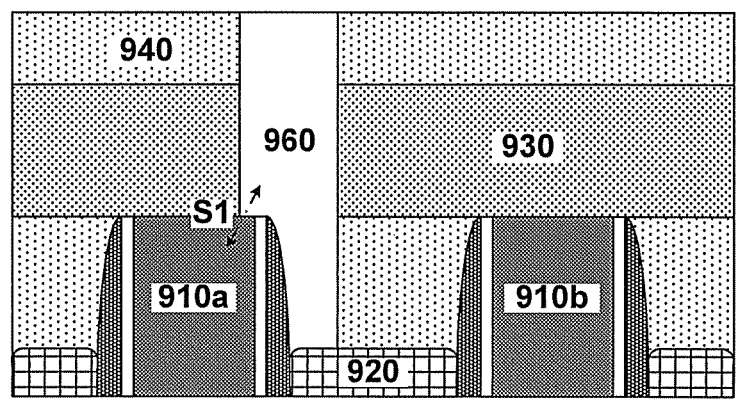
FIG. 50 illustrates a structure comprising a contact opening incorrectly positioned with respect to at least one gate structure and resulting gate shorting.
Figure 51:
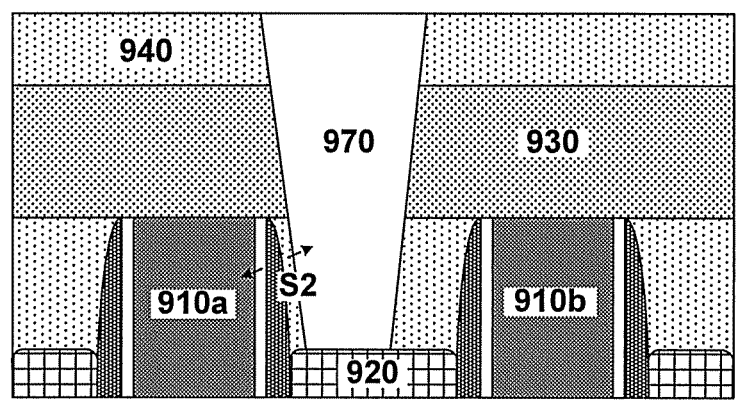
FIG. 51 illustrates a structure comprising a contact opening incorrectly positioned with respect to at least one gate structure and resulting gate shorting/current leakage.

The subject innovation presents various techniques relating to minimizing electrical shortage and/or current leakage between gate regions and nearby connectors in a semiconductor device. As described in the background, owing to increased scaling of semiconductor devices, the ability to accurately locate a contact with reference to a nearby gate structure with minimal risk of electrical shortage/current leakage is limiting the degree of scaling that can be achieved. Further, owing to the degree of positional tolerancing required (e.g., FIG. 49, ±q) when utilizing contacts constructed with self aligning techniques, such techniques are placing a minimum distance requirement between a pair of gates in an effort to ensure that a self aligning contact is not placed in vicinity of a gate such that an electrical flowpath can be established between the self aligning contact and the gate (s). Presented herein are a number of embodiments whereby a portion of a gate structure material (e.g., a gate metal, such as Al) is chemically modified (e.g., oxidized) to form an insulator material which acts to electrically isolate the remainder of the conductive gate material from a connector, even in a situation where the connector is at least partially located on the gate material structure or in electrical vicinity thereof (e.g., as depicted in FIGS. 50 and 51).

General Process for Formation of a RMG Comprising an Isolation Region

FIGS. 1-11, 16 and 17 illustrate a series of exemplary, non-limiting embodiments to facilitate formation of an RMG structure comprising a modified region to facilitate electrical isolation of the RMG structure from a contact in the vicinity thereof, e.g., the contact is formed to locate on the modified region of the RMG structure. FIGS. 1-11, 16 and 17, while presenting an outline of various exemplary, non-limiting embodiments as disclosed herein, also provide the basis for a number of alternative systems and methods for obtaining a gate structure comprising an isolation region as further described in FIGS. 18-48.

The various exemplary, non-limiting embodiments presented herein, in effect, utilize a process of exposing a gate structure material to facilitate chemical modification of the material. In an embodiment, an oxidizing atmosphere can be utilized to facilitate formation of an oxide to create an insulator region to electrically isolate the gate structure from a subsequently formed contact, where the contact is formed in the vicinity of the gate structure. In a further embodiment, the gate material can be a metal (e.g., aluminum) which is converted to a metal oxide (e.g., $Al_2O_3$).

To provide understanding of the various concepts presented herein, FIGS. 1-11, FIGS. 18-26, FIGS. 28-36 and FIGS. 38 to 47 illustrate formation of respective nFET and pFET gates, whereby exemplary layers of deposited layers are shown to form the respective gates. Hence, while the following Figures illustrate gate regions comprising an nFET gate and a pFET gate, it is to be appreciated that the illustrations are presented to relate the concept of formation of an isolating region with such isolating regions being formed on nFET and pFET gates, however it is to be anticipated that a contact is typically positioned between a pair of similar gates, e.g., between a pair of nFET gates or a pair of pFET gates, whereby a nFET gate and a pFET gate are isolated by such technique as shallow trench isolation. Thus, while in the following illustrations (e.g., FIGS. 11, 26, 36, and 47) a nFET gate is illustrated next to a pFET gate, such illustration is merely to enable depiction of how an isolation region may be formed in a nFET gate structure or a pFET gate structure. Typically a first nFET gate will be co-located with a second nFET gate with the connector being formed therebetween, and alternatively, a first pFET gate will typically be co-located with a second pFET gate with the connector formed therebetween. Hence, while the following typically present operations being performed concurrently on an nFET gate and a pFET gate, the operations can be performed in isolation, i.e., the operations are only performed on nFET gate(s) or only on pFET gate(s).

Figure 1:
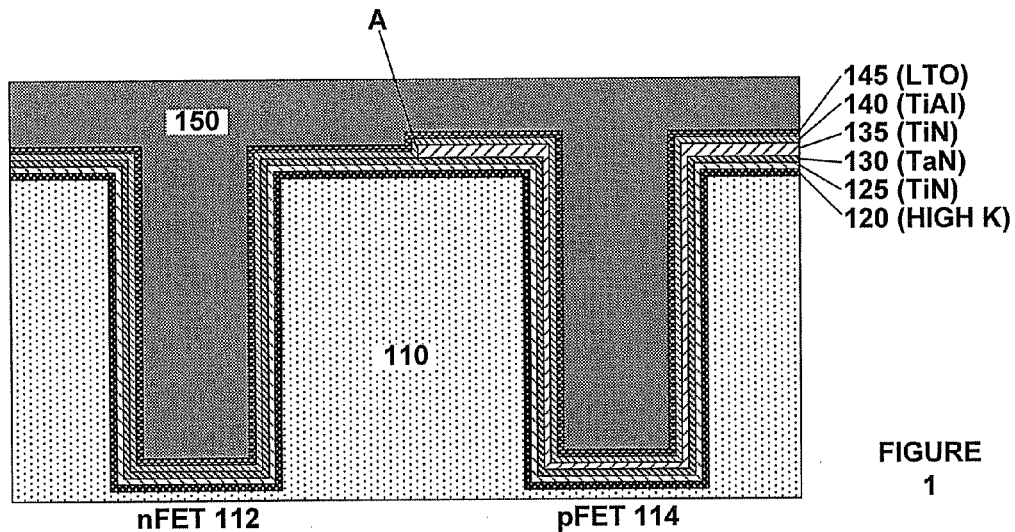
FIG. 1 is a block diagram illustrating a non-limiting, exemplary embodiment of an initial structure in the formation of a gate structure comprising an insulative portion.

FIG. 1 illustrates an initial structure for subsequent processing for formation of a gate incorporating a modified region facilitating isolation of the gate from other components, e.g., a subsequently formed contact located in vicinity of the gate structure. The initial structure of FIG. 1 comprises a substrate 110 (e.g., a substrate comprising Si, Si-compound, etc.), which can been patterned (by any suitable process) to form required gate regions, such as regions of an nFET gate 112 or a pFET gate 114. A plurality of work function layers associated with the respective nFET gate 112 and pFET gate 114 are formed thereon. For example, a high K layer 120, a TiN layer 125, and a TaN layer 130 are sequentially formed on the nFET gate 112 and pFET gate 114 regions. A second TiN layer 135 is further deposited in the pFET 114 gate region, followed by formation of a TiAl layer 140, and a low temperature oxide (LTO) layer 145 over both of the nFET gate 112 and pFET gate 114 regions. Finally a resist layer 150 is formed over the entire structure. It is to be appreciated that while respective layers 125, 130, 135, 140 and 145 have been indicated to be comprised of a particular element/compound (e.g., layer 125 comprises TiN) other elements/compounds can be utilized for a respective layer based on the requirements/construction of a particular semiconductor device. Similarly, the number of layers utilized in a construction of a particular semiconductor device is not limited by the number of layers presented here but rather can be of any number/composition as required for construction of a particular semiconductor device.

Figure 2:
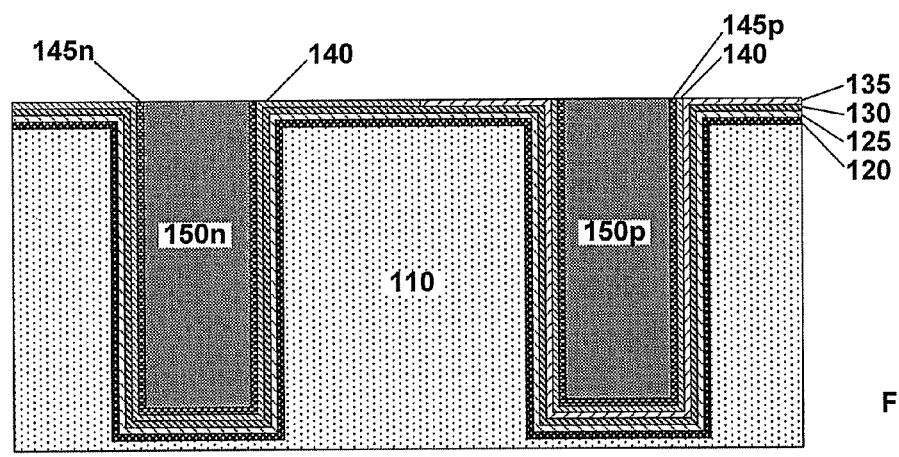
FIG. 2 is a block diagram illustrating a non-limiting, exemplary embodiment of CMP performed on a structure in the formation of a gate structure comprising an insulative portion.

As illustrated in FIG. 2, a chemical mechanical polish/planarization (CMP) operation is performed. The CMP operation removes unwanted resist layer 150 to facilitate formation of respective resist structures 150n and 150p relative to the nFET 112 region and pFET 114 region. Further, with respect to the various layers 120-145, the CMP operation removes the upper horizontal portion of LTO layer 145 in the nFET 112 region thereby exposing the underlying layer 140. Hence a resist region 150n is formed with an LTO layer 145 formed therearound. At the pFET 114 region the horizontal portions of both the LTO layer 145 and the TiAl layer 140 are removed thereby leaving TiN layer 135 exposed at the pFET 114 region, and resist region 150p is formed with an LTO layer 145p formed therearound.

Figure 3:
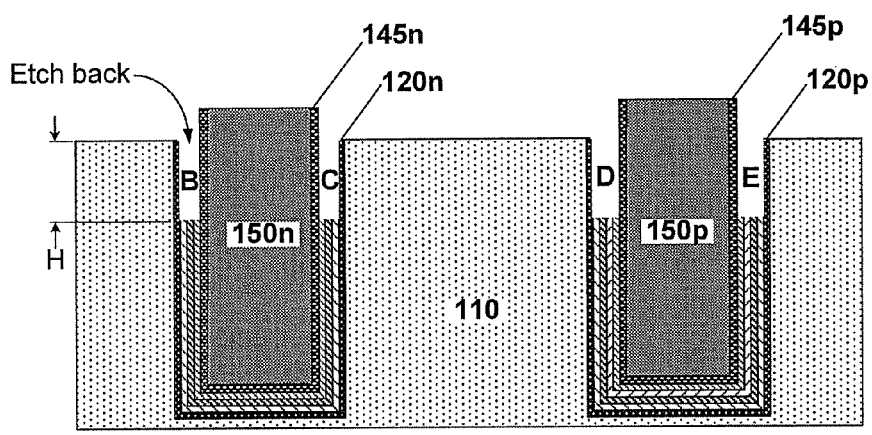
FIG. 3 is a block diagram illustrating a non-limiting, exemplary embodiment of etching performed on a structure in the formation of a gate structure comprising an insulative portion.

FIG. 3 illustrates an etching operation being performed which removes portions of layers 120-140. The etching operation can be, in part, an etch back operation which removes respective portions of layers 125-140 to form openings B and C at the nFET gate 112 region and/or openings D and E at the pFET gate 114 region. In an embodiment, the etching operation can be a metal selective etch based operation to selectively remove Ti- and Ta-based layers while leaving the high K and LTO layers. In an embodiment, openings B, C, D and E can be formed to a common depth H. Further, supplemental to the etching operation the horizontal portions of the high K layer 120 are removed thereby exposing the substrate 110, while layers 120n and 120p remain in the respective nFET gate region 112 and pFET region 114 recesses.

Figure 4:
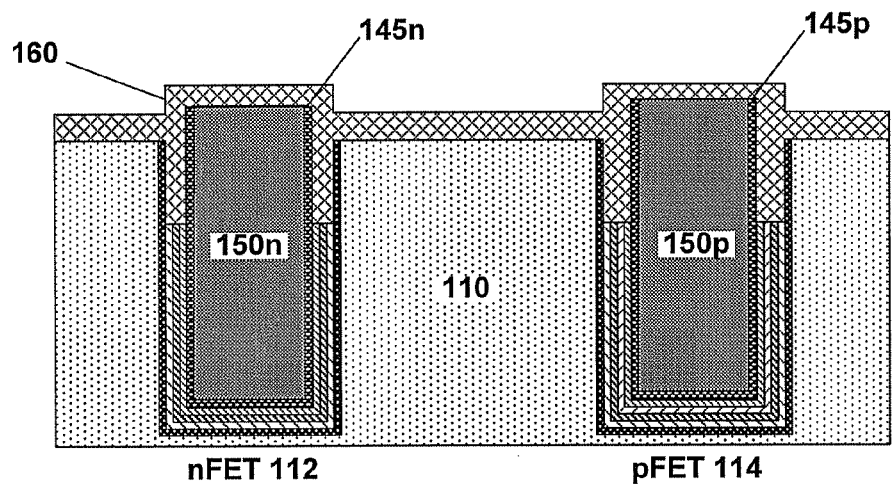
FIG. 4 is a block diagram illustrating a non-limiting, exemplary embodiment of nitride layer formation in the formation of a gate structure comprising an insulative portion.

Subsequent to the etching operation, as shown in FIG. 4, an insulator layer 160, e.g., a nitride (NIT) layer, is deposited on the surface, whereby respective openings B, C, D and E (see FIG. 3) are filled with the insulator material.

Figure 5:
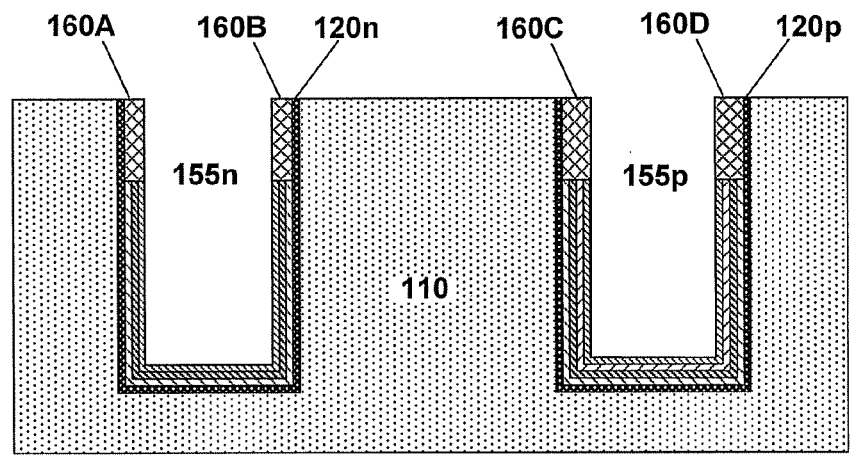
FIG. 5 is a block diagram illustrating a non-limiting, exemplary embodiment of CMP, resist stripping and oxide layer stripping in the formation of a gate structure comprising an insulative portion.

FIG. 5 illustrates surface planarization and resist removal. A CMP operation is performed to facilitate removal of any unwanted portion of insulator layer 160, whereby NIT layer portions 160A-D remain. Further resist structures 150n and 150p are stripped along with the remaining LTO layers 145n and 145p, leaving recesses 155n and 155p.

Figure 6:
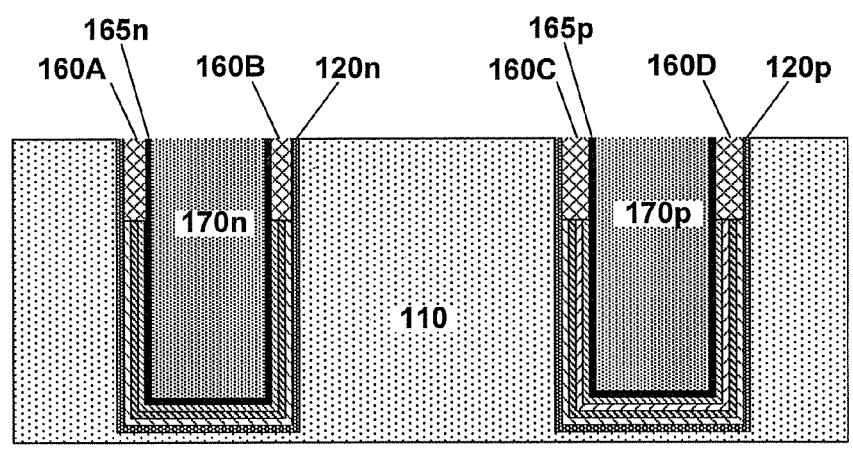
FIG. 6 is a block diagram illustrating a non-limiting, exemplary embodiment of formation of a metal layer, a conductive gate, and CMP in the formation of a gate structure comprising an insulative portion.

FIG. 6 illustrates formation of gate material in the nFET and pFET recesses. In each recess 155n and 155p a layer of Ti is deposited, Ti layers 165n and 165p, to line the respective recesses. Gate material (e.g., Al) is deposited to form gate structures 170n and 170p. A CMP operation is performed to facilitate removal of excess Ti layer and/or gate material.

Figure 7:
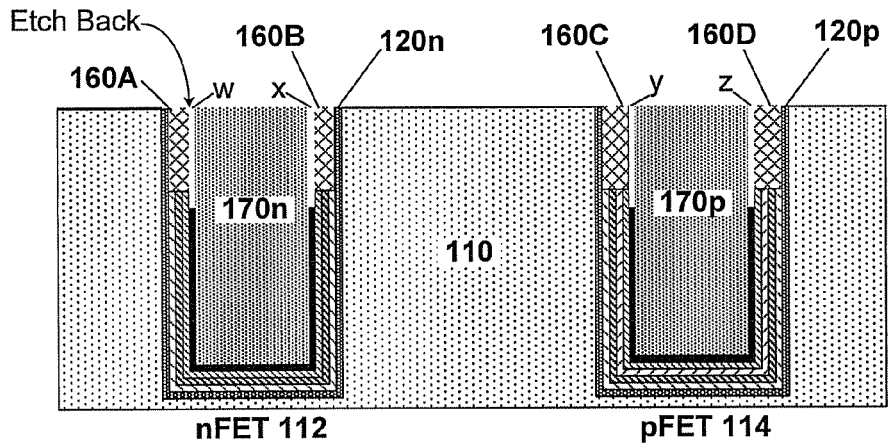
FIG. 7 is a block diagram illustrating a non-limiting, exemplary embodiment of etching a metal layer in the formation of a gate structure comprising an insulative portion.

FIG. 7 depicts an etching operation being performed to remove an amount of Ti layer to facilitate exposure of a portion of the respective sidewalls of gate structures 170n and 170p. The etching operation can be of any suitable technique (e.g., a wet etch) to facilitate removal of a required portion of Ti layers 165n and 165p to form respective openings w, x, y, and z.

Figure 8:
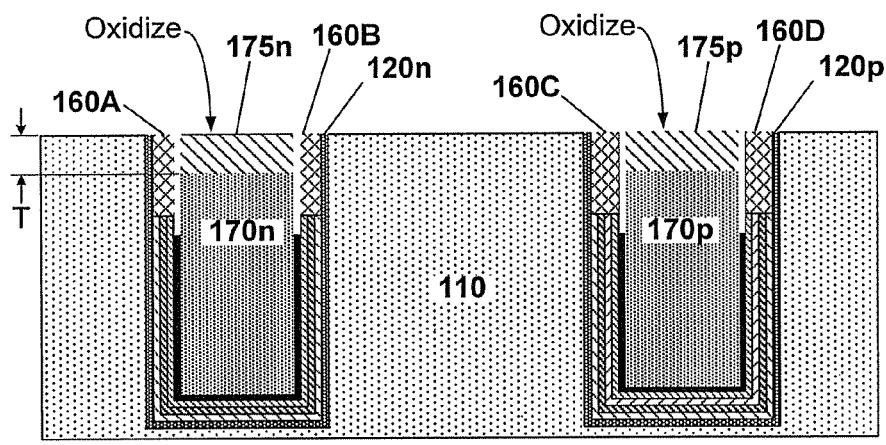
FIG. 8 is a block diagram illustrating a non-limiting, exemplary embodiment of modifying a gate material to form an insulating region in the formation of a gate structure comprising an insulative portion.

FIG. 8 illustrates a gate material modification process being performed. As previously mentioned, gate structures 170n and 170p can be formed from any suitably conductive material, such as aluminum. Selection of the gate material is made with consideration of the ability to modify a portion of the suitably conductive material to render the modified portion to have insulative properties and thus is no longer able to act as a pathway for flow of electrical current, etc. With such consideration, aluminum is a suitable material, where in the presence of an oxidizing atmosphere, aluminum metal (a conductor) reacts with oxygen to form $Al_2O_3$ (an insulator). As depicted in FIG. 8, by having the walls of the gate structures 170n and 170p exposed (per FIG. 7, openings w, x, y, z), the surface area of aluminum exposed to the oxidizing atmosphere is such that the respective volume of $Al_2O_3$ forming portions 175n and 175p is maximized compared with oxidizing flat profile structures having no exposed sidewalls (ref. FIGS. 12-15 for further illustration of the concept). The depth of insulator forming structures 175n and 175p is controlled to a depth T.

Figure 9:
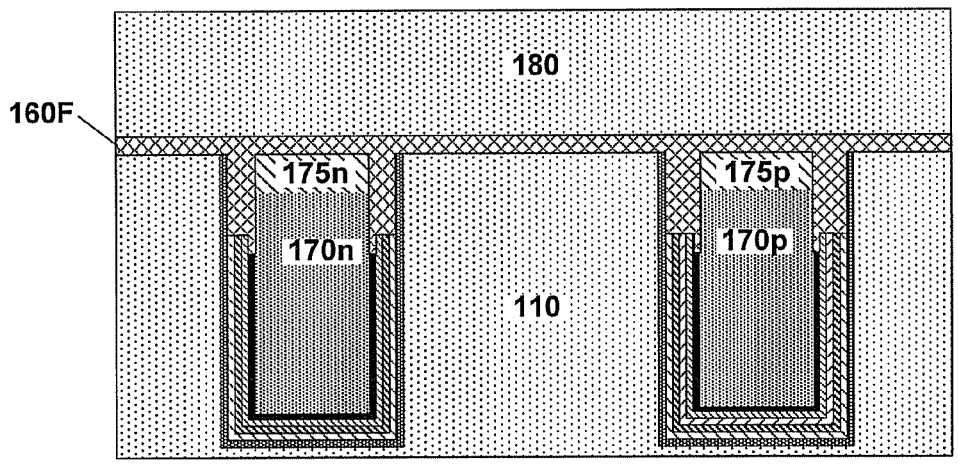
FIG. 9 is a block diagram illustrating a non-limiting, exemplary embodiment of capping the gate with a nitride layer and depositing an interlayer dielectric in the formation of a gate structure comprising an insulative portion.

FIG. 9 illustrates further construction of the gate structures. Further insulator (e.g., nitride) is deposited on the structure to facilitate formation of a insulative capping layer, layer 160F, which incorporates insulator layer portions 160A-D along with filling openings w, x, y and z. Further, an interlayer dielectric (ILD) layer 180 is formed on insulator layer 160F.

Figure 10:
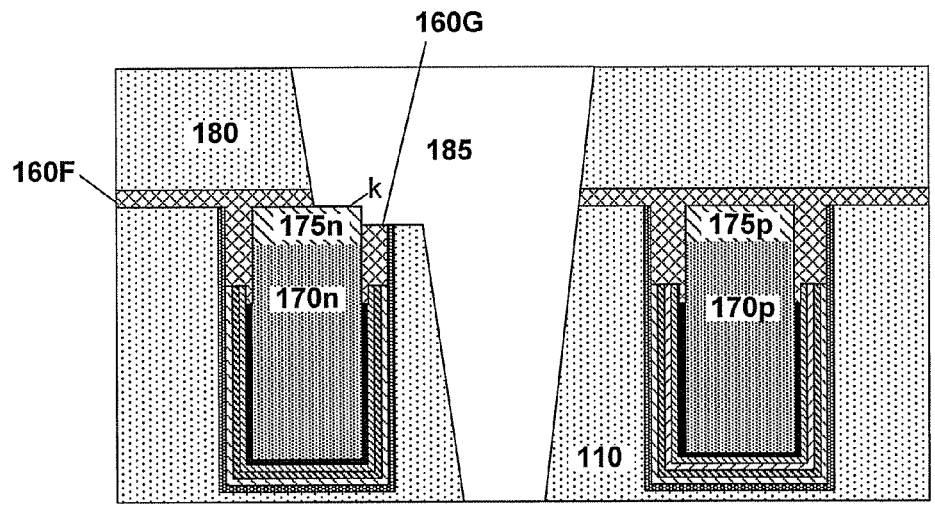
FIG. 10 is a block diagram illustrating a non-limiting, exemplary embodiment of forming a contact opening in the formation of a gate structure comprising an insulative portion.

FIG. 10 illustrates an opening (e.g., a trench, via opening, etc.) being formed in the semiconductor structure. As illustrated, in this example, opening 185 is such that it exposes a surface portion k of insulating structure 175n. It is to be appreciated that opening 185 can equally be positioned to expose insulating structure 175p (e.g., opening 198, as described further below). Further, formation of opening 185 removes a portion of insulating layer 160F to create insulator portion 160G which compliments insulating structure 175n in further isolating gate 170n from opening 185. In an embodiment, insulator portion 160G acts to further electrically isolate any of TiN layer 125, TaN layer 130, TiN layer 135, and/or TiAl layer 140 from connector 194 and barrier layer 192. Hence, owing to the various embodiments presented herein being amenable to exposure of a portion of a gate insulating structure (e.g., 175n or 175p), the accuracy with which an opening is located (e.g., opening 185, to be subsequently filled with conductor) is not as critical in comparison to the accuracy required to form either of conductive pathways 960 or 970 (as shown in FIGS. 50 and 51). Hence, with a semiconductor constructed with conventional techniques, critical dimensioning (e.g., distance between gates, size of opening, placement of opening) is being constrained. However, with the various embodiments presented herein, the distance between gates can be reduced/shortened while still enabling an opening to be formed therebetween without risk of gate shortage, current leakage, etc.

Further, with openings that are formed by self aligning, even in a situation where a self aligned opening is not positioned in an ideal location (e.g., equidistant between a pair of gates), owing to the tolerance of opening misalignment afforded by the various embodiments presented herein a self aligned opening can be utilized without risk of gate shortage, current leakage, etc.

Figure 11:
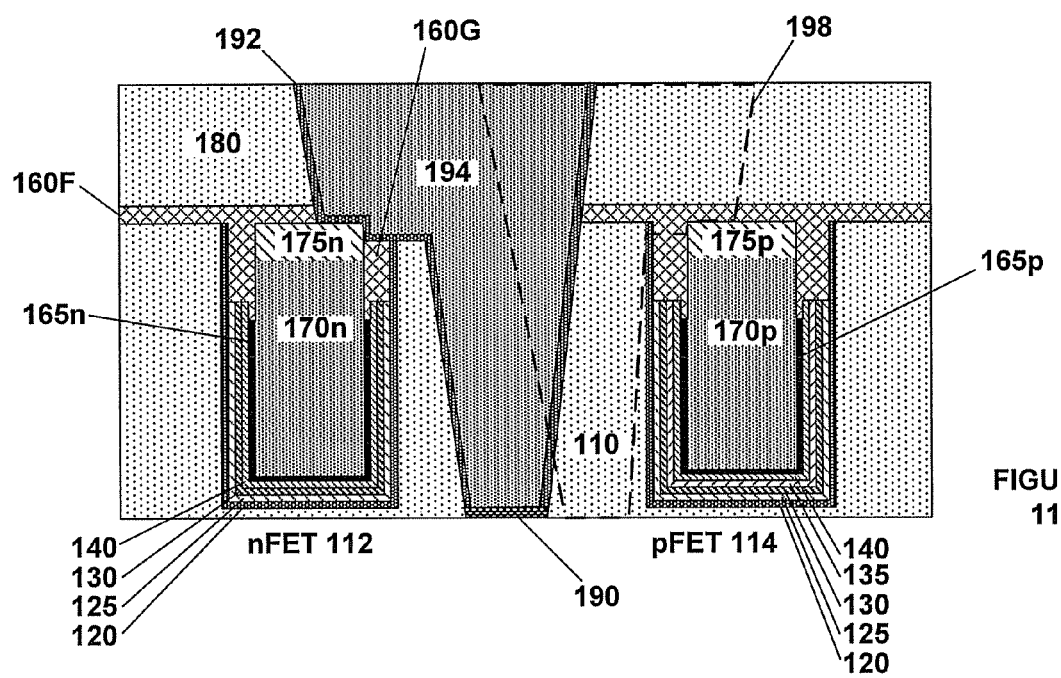
FIG. 11 is a block diagram illustrating a non-limiting, exemplary embodiment of forming a contact in the formation of a gate structure comprising an insulative portion.

FIG. 11 illustrates a final semiconductor structure according to an exemplary, non-limiting embodiment. A contact 190 is formed at the base of opening 185, where contact 190 can be formed from any suitable material and technique (e.g., a nickel silicide, NiSi). In an embodiment, a channel region (not shown) can be located beneath contact 190, wherein contact 190 is a region of silicide (e.g., trench silicide) formed at the bottom of the opening. The opening is then lined with any suitable material to form barrier layer 192, where the barrier material process of formation can be by any applicable technology as is known in the art. Finally, the remainder of opening 185 is filled with conductor 194 (e.g., tungsten (W)) as utilized with RMG technology and associated contact technology, such as a self aligned contact, as previously described.

To provide understanding of the various concepts presented herein, FIGS. 1-11, FIGS. 18-26, FIGS. 28-36 and FIGS. 38 to 47 illustrate formation of respective nFET and pFET gates, whereby exemplary layers of deposited layers are shown to form the respective gates. It is to be appreciated that the gate structures are exemplary and provided to enable understanding of how a contact can be formed which is electrically isolated from a gate region. For example, with reference to FIGS. 1-11, while a contact is shown being formed in vicinity of nFET 112, the contact can be formed in a similar manner with reference to pFET 114, whereby gate insulating structure 175*p* can act to isolate gate 170*p* from a conductor, as depicted by broken line 198. With respect to FIGS. 18-26, broken line 298 depicts a connector being isolated from gate 270*p* by gate insulating structure 275*p*. With respect to FIGS. 28-36, broken line 398 depicts a connector being isolated from gate 370*p* by gate insulating structure 375*p*. With respect to FIGS. 38-47, broken line 498 depicts a connector being isolated from gate 470*p* by gate insulating structure 475*p*.

Figure 12:
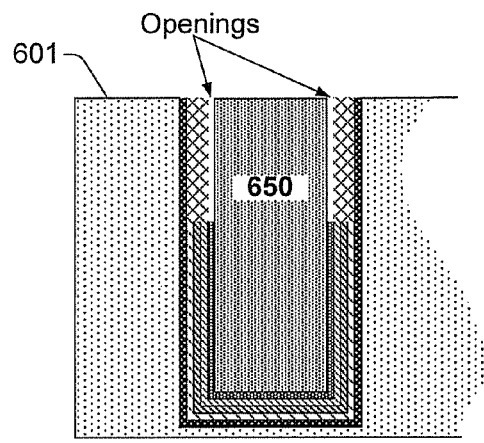
FIG. 12 is a block diagram illustrating a non-limiting, exemplary embodiment for forming a gate structure comprising an insulative portion.
Figure 13:
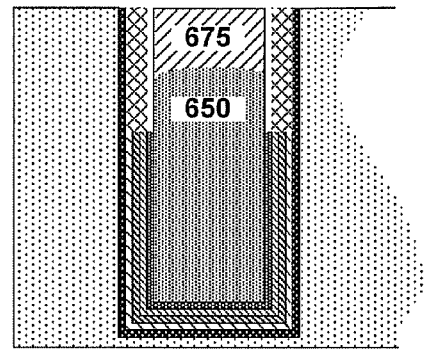
FIG. 13 is a block diagram illustrating a non-limiting, exemplary embodiment for forming a gate structure comprising an insulative portion.
Figure 14:
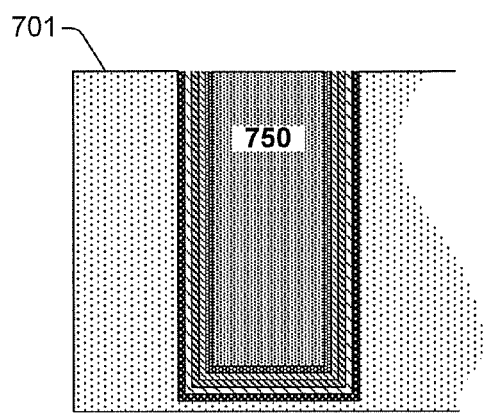
FIG. 14 illustrates a structure for forming a gate structure comprising an insulative portion.
Figure 15:
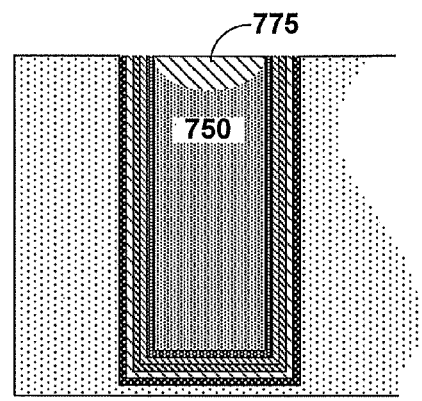
FIG. 15 illustrates a structure for forming a gate structure comprising an insulative portion.

FIGS. 12-15 are presented to illustrate the concept of creating openings to expose sidewalls of a gate material to facilitate improved conversion of a conducting material to a non-conducting material. FIGS. 12 and 13 are exemplary, non-limiting embodiments with regard to various concepts presented herein. FIG. 12, component 601 comprises a gate structure 650 where the sidewalls have been exposed to create openings. In an embodiment, the openings can be a result of removal of material adjacent to the gate structure 650 (e.g., FIG. 7, etch back of layer 165*n* or 165*p* to form openings w, x, y, or z). The openings increase the surface area of gate structure 650 exposed to the oxidizing atmosphere to facilitate increased exposure of gate region 650 for conversion to insulating material, gate region 675, FIG. 13. In comparison, as shown in FIGS. 14 and 15, component 701 has no openings exposing the sidewalls of gate structure 750 and thus only the top surface of gate structure 750 is exposed to the oxidizing atmosphere. Accordingly, in comparison with insulator region 675, a reduced volume of insulator region 775 is created under the same processing conditions as utilized to create region 675. As previously mentioned, gate structures 650 and 750 can be formed of a material that in one physical state is a conductor and in another physical state a non-conductor 675 and 775, where the state change can be a result of chemical modification such as oxidation, for example, aluminum being oxidized to form aluminum oxide.

Figure 16:
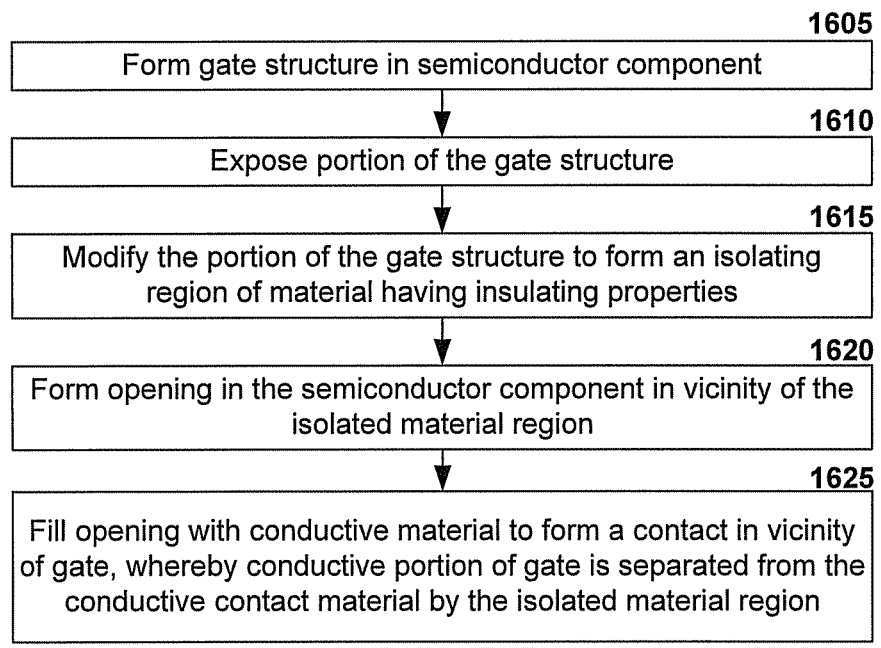
FIG. 16 illustrates a flow for forming a gate structure comprising an insulative portion in accordance with one or more embodiments of the subject innovation.

FIG. 16 presents a flow diagram illustrating an exemplary, non-limiting embodiment to facilitate forming an RMG structure comprising a modified region to facilitate electrical isolation of the RMG structure from a contact formed in the vicinity thereof. As previously described, the various exemplary, non-limiting embodiments presented herein, effectively utilize a gate material (e.g., a conductor such as aluminum) which can be modified (e.g., chemically) from a conductive state (e.g., metallic state) to a non-conductive state (e.g., non-metallic, insulator, etc.). By modifying a portion of the gate material to have insulating properties, the modified portion can be utilized to isolate the unmodified, conductive material from a conductive component (e.g., a connector) subsequently formed in the vicinity of the gate.

At 1605, an initial structure is formed, whereby one or more structures comprising a gate (e.g., a nFET gate, a pFET gate) are formed as part of a semiconductor component.

At 1610, a portion of the gate structure (e.g., gate structures 170*n*, 170*p*, etc.) is exposed to facilitate subsequent modification of a portion of the gate structure material from a conductive state to a non-conductive state, as explained further below and also in conjunction with FIGS. 12-15).

At 1615, chemical modification of the exposed portion of the gate structure material occurs. In an exemplary, non-limiting embodiment, the gate structures (e.g., gate structures 170*n*, 170*p*, etc.) can comprise aluminum, which under exposure to an oxidizing atmosphere will chemically convert from metallic, conductive, aluminum to non-metallic, non-conductive, aluminum oxide (e.g., $Al_2O_3$). Based upon such factors as surface area of exposed portion, exposure conditions, e.g., oxygen concentration, length of exposure, temperature, etc., the chemical modification can be controlled to facilitate 'growth' of an oxidized region (e.g., 175*n*, 175*p*, etc.) of the metallic gates (e.g., 170*n*, 170*p*, etc.).

Figure 49:
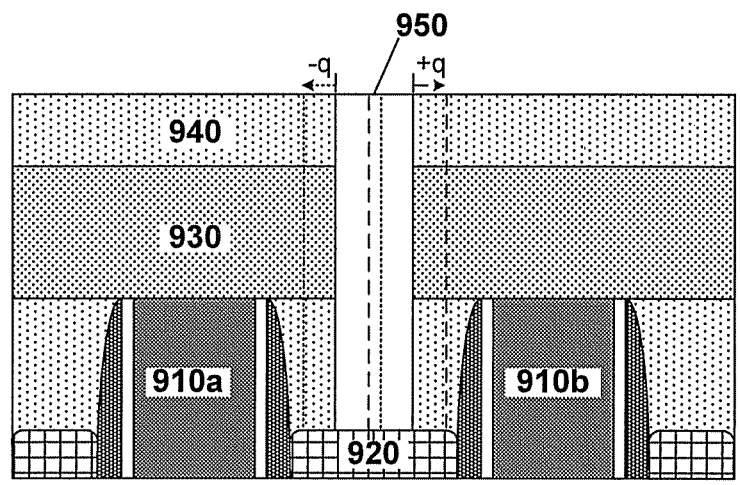
FIG. 49 illustrates a structure comprising a contact opening correctly positioned with respect to at least one gate structure.

At 1620, an opening is formed, e.g., for manufacture of a connector, in the vicinity of the gate structure (e.g., 170*n* and 175*n*, 170*p* and 175*p*, etc.) to facilitate connection to a further structure located thereby (e.g., a source/drain such as 920 local to gates 910*a* and/or 910*b*, as shown in FIG. 49). Owing to the insulator regions (e.g., 175*n*, 175*p*, etc.) acting to isolate the conductive regions of the gate (e.g., 170*n*, 170*p*, etc.), as described previously, placement of the opening is not as critical dimensionally as compared with a conventional gate structure which doesn't comprises an isolation portion.

At 1625, the opening is filled with conductive material as required for formation of the connector (e.g., connector 194). As mentioned, the insulator regions (e.g., 175*n*, 175*p*, etc.) facilitate electrical isolation of the conductive gate regions (e.g., 170*n*, 170*p*, etc.) from the conductive material of the connector.

Figure 17:
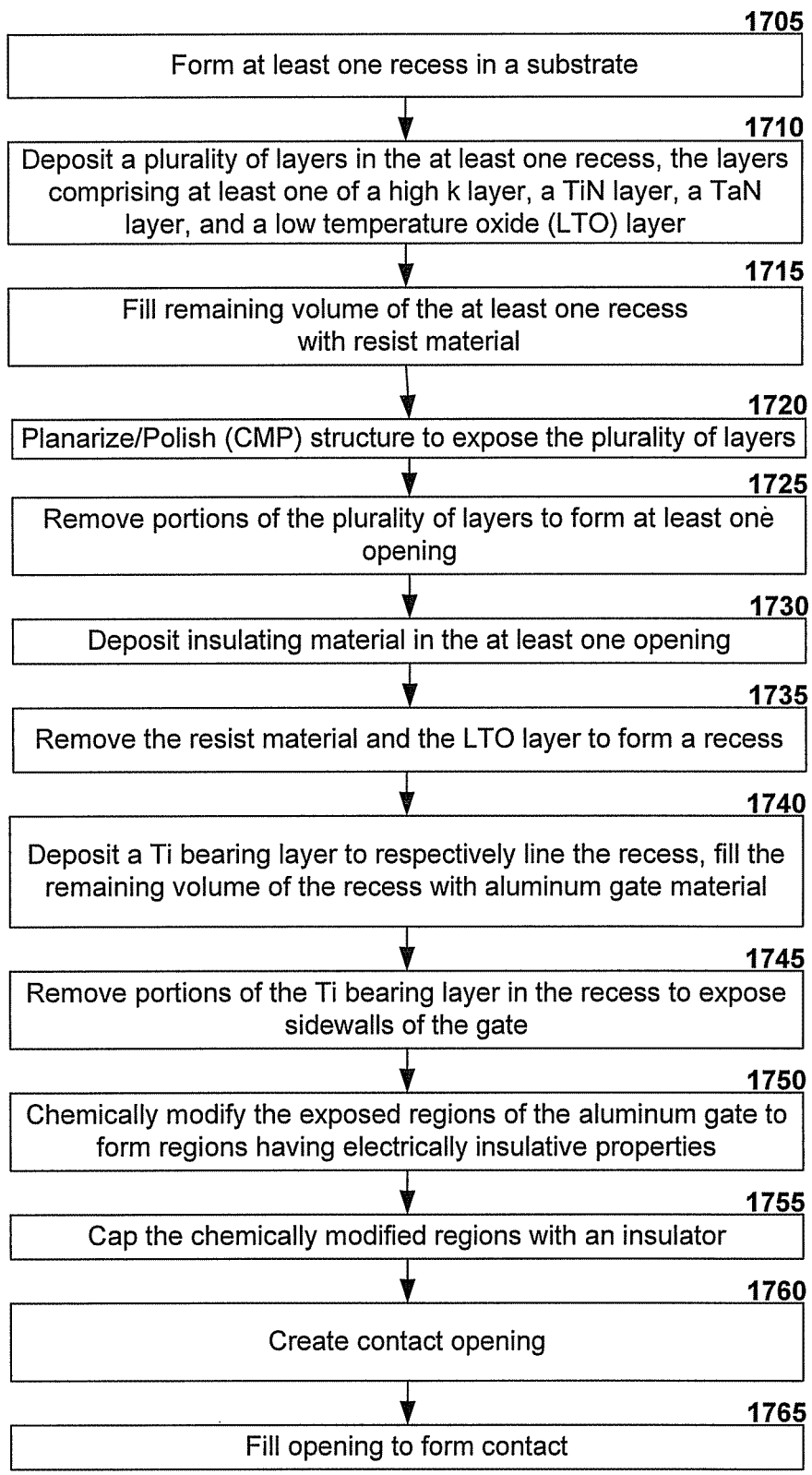
FIG. 17 illustrates a flow for forming a gate structure comprising an insulative portion in accordance with an exemplary, non-limiting embodiment.

FIG. 17 presents a flow diagram illustrating an exemplary, non-limiting embodiment to facilitate forming an RMG structure comprising a modified region to facilitate electrical isolation of the RMG structure from a contact formed in the vicinity thereof. As previously described, the various exemplary, non-limiting embodiments presented herein, effectively utilize a gate material which can be modified from a conductive state to a non-conductive state. By modifying a portion of the gate material to have insulating properties, the modified portion can be utilized to isolate the unmodified, conductive material from a conductive component (e.g., a connector) subsequently formed in the vicinity of the gate.

At 1705, an initial structure is formed, whereby one or more structures comprising a gate (e.g., a nFET gate, a pFET gate) are formed as part of a semiconductor component. In an exemplary, non-limiting embodiment, at least one recess is formed (e.g., by any suitable patterning) relative to a nFET gate region and/or a pFET gate region (e.g., nFET 112 and/or pFET 114) in a substrate (e.g., substrate 110).

At 1710, the at least one recess is subsequently lined with various layers (e.g., high k layer 120, TiN layer 125, TaN layer 130, TiN layer 135, TiAl layer 140, and/or a LTO layer 145) as required for formation and operation of the semiconductor device.

At 1715, a resist is deposited to fill the remaining recess volume(s) (e.g., 150*n* and/or 150*p*).

At 1720, a CMP operation is performed to facilitate formation of at least one recessed region.

At 1725, an etching operation is performed to facilitate formation of at least one opening. The opening (e.g., FIG. 3, openings B+C, D+E) can be formed as a result of an etch back operation removing portions of the deposited layers (e.g., layers 125, 130, 135 and/or 140). The openings can be formed to a common depth (e.g., FIG. 3, depth H).

At 1730, a layer (160) of insulating material (e.g., a nitride) is deposited to fill the openings (e.g., FIG. 3, openings B/C, D/E).

At 1735, surface planarization (e.g., CMP) and resist removal (e.g., resists 150n and/or 150p) operations are performed including the removal of remaining LTO layer (e.g., layer 145) to form at least one new recess relative to either of the nFET and/or pFET gates.

At 1740, a metal bearing layer (e.g., a Ti layer) is deposited to line the new recess along with gate material (e.g., Al) to fill the new recess, thereby forming a gate structure (e.g., either of 170n or 175p) surrounded by a layer (e.g., layers 165n or 165p). A CMP operation can be performed to remove and excess material (e.g., Ti or Al).

At 1745, portions of the metal bearing layers (e.g., Ti layers 165n or 165p) are removed (e.g., by an etch back operation) to expose sidewalls of the gate structure (e.g., 170n or 170p) at the etched back openings (e.g., FIG. 7, openings w+x, y+z).

At 1750, the gate structure undergoes chemical modification to facilitate formation of a non-conductive region and a conductive region. In an exemplary, non-limiting embodiment, the gate structure is exposed to an oxidizing atmosphere to facilitate formation of an oxide region (e.g., either of regions 175n or 175p) in conjunction with the remainder of the metallic regions (e.g., regions 170n or 170p). A portion of the original gate structure (e.g., region 170n or 170p) is chemically modified to an insulator material (e.g., region 175n or 175p).

At 1755, the chemically modified regions are capped with insulator (e.g., layer 160F) to fill the openings (e.g., FIG. 7, openings w+x or y+z) to facilitate encapsulation of the top and sidewalls of the modified regions (e.g., 175n or 175p). Further layers (e.g., an ILD layer 180) can be formed on the insulator layer.

At 1760, an opening is formed in the layered structure (e.g., layers 180, 160F, 110) for a contact. The opening can be positioned such that the modified region (e.g., either of 175n or 175p) is exposed. Further the opening can cause removal of the insulator layer such that a portion (e.g., FIG. 10, portion 160G) remains to further isolate the underlying gate (e.g., 170n).

At 1765, a series of operations are undertaken to facilitate formation of a first contact (e.g., a trench silicide 190) at the bottom of the opening to facilitate electrical connection with a layer located at the bottom of the opening, a layer lining the opening (e.g., barrier layer 192) and subsequently filled with conductor (e.g., connector 194).

Process Variations for Formation of a RMG Comprising an Isolation Region

As described above, FIGS. 1-16 present a series of exemplary, non-limiting embodiments to facilitate formation of an RMG structure comprising a modified region to facilitate electrical isolation of the RMG structure from a contact in the vicinity thereof. FIGS. 1-16, while presenting an outline of various exemplary, non-limiting embodiments as disclosed herein, also provide the basis for a number of alternative systems and methods for obtaining a gate structure comprising an isolation region as further described in FIGS. 13-44. A first variation of the general process depicted in FIGS. 1-11 (and accompanying flows in FIGS. 16 and 17) is shown in the following series of FIGS. 18-26 (and accompanying flow in FIG. 27), a second variation in shown in the series of FIGS. 28-36 (and accompanying flow in FIG. 37), and a third variation is shown in the series of FIGS. 38-47 (and accompanying flow in FIG. 48).

Further, in the following description regarding FIGS. 1-11, 18-26, 28-36, and 38-47, the following elements can, in an aspect, be considered common: substrates 110, 210, 310, and 410, layers 120, 220, 320, and 420, layers 125, 225, 325, and 425, layers 130, 230, 330, and 430, layers 135, 235, 335, and 435, layers 140, 240, 340, and 440, layers 145, 245, 345, and 445, layers 160, 260, 360, and 460, nFET 112, 212, 312, and 412, pFET 114, 214, 314, and 414, insulator layer 160, 260, 360, and 460, gate material 170, 270, 370, and 470, gate insulator 175, 275, 375, and 475, ILD layer 180, 280, 380 and 480, barrier layer 192, 292, 392, and 492, contact (e.g., a trench silicide) 190, 290, and 490, contact material 194, 294, 394, and 494, and alternative connector 198, 298, 398, and 498, etc. However, it is to be appreciated that the sequence with which a respective structural element is formed, removed, the thickness of the formed structural element, etc., can vary from one process to another (e.g., respective processes presented in Figure sequences 1-11, 18-26, 28-36 and 38-47) as presented herein. Further, the material or operation to form and/or remove a respective structural element can vary from one process to another, as presented herein. Hence comparable structures and processes presented in FIGS. 18-26, 28-36 and 38-47 will only be briefly described to minimize duplication, and for a further understanding of the various aspects reference should be made to comparable elements and processes described with reference to FIGS. 1-11.

Process Variation #1 for Formation of a RMG Comprising an Isolation Region

Figure 18:
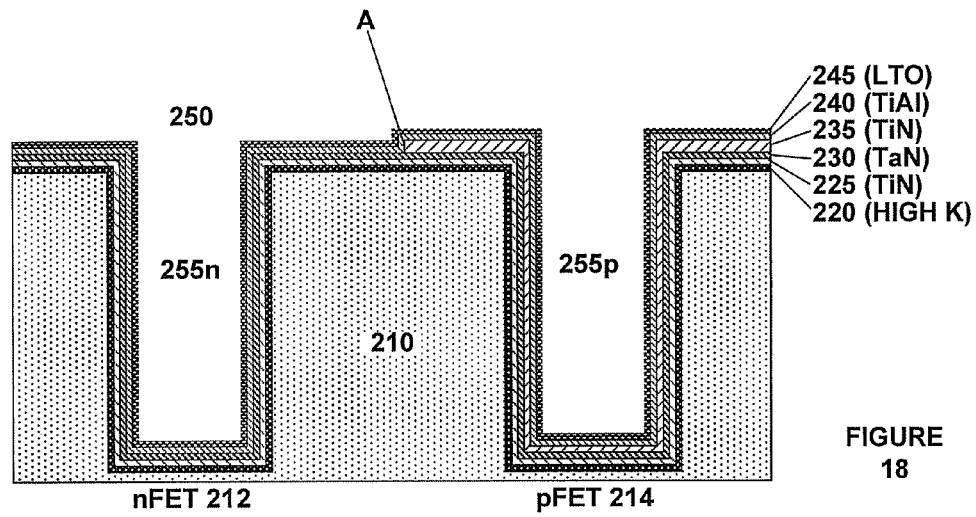
FIG. 18 is a block diagram illustrating a non-limiting, exemplary embodiment of an initial structure in the formation of a gate structure comprising an insulative portion.

A first variation of the general process depicted in FIGS. 1-11 is shown in the following series of FIGS. 18-26 illustrating exemplary, non-limiting embodiments for formation of an RMG structure comprising a modified region to facilitate electrical isolation of the RMG structure from a contact in the vicinity thereof. In summary, the embodiment presented in FIGS. 18-26 differs from that presented in FIGS. 1-11 in that the initial structure of FIG. 1 comprises the recess(es) being filled with resist material 150, while FIG. 18 presents an open recess(es) 255n and/or 255p which affects the subsequent sequence of operations.

FIG. 18 illustrates an initial structure for subsequent processing for formation of a gate incorporating a modified region facilitating isolation of the gate from other components, e.g., a subsequently formed contact located in vicinity of the gate structure. The initial structure of FIG. 18 comprises a substrate 210, which has been patterned to form a respective recess, e.g., recess 255n and/or 255p in the nFET gate 212 and pFET gate 214 regions. A plurality of work function layers associated with the respective nFET gate 212 and pFET gate 214 are formed thereon. A high K layer 220, a TIN layer 225, and a TaN layer 230 are sequentially formed on the nFET gate 212 and pFET gate 214 regions. A second TIN layer 235 is further deposited in the pFET 214 gate region, followed by formation of a TiAl layer 240, and a low temperature oxide (LTO) layer 245 over either of the nFET gate 212 region or the pFET gate 214 region.

Figure 19:
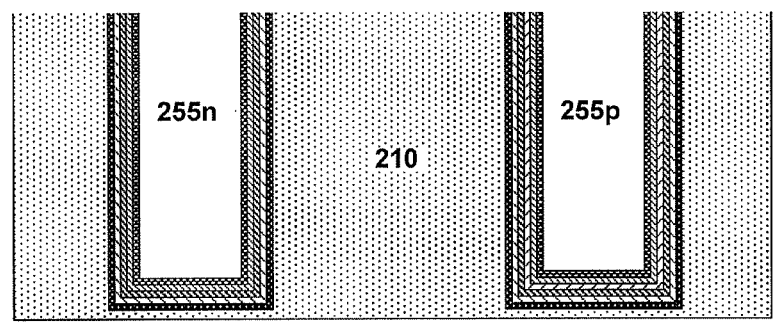
FIG. 19 is a block diagram illustrating a non-limiting, exemplary embodiment of CMP performed on a structure in the formation of a gate structure comprising an insulative portion.

As illustrated in FIG. 19, a CMP operation is performed. The CMP operation removes the upper horizontal portions of layers 220, 225, 230, 235, 240, and 245, to leave portions of the respective layers lining the recesses 255n and 255p.

Figure 20:
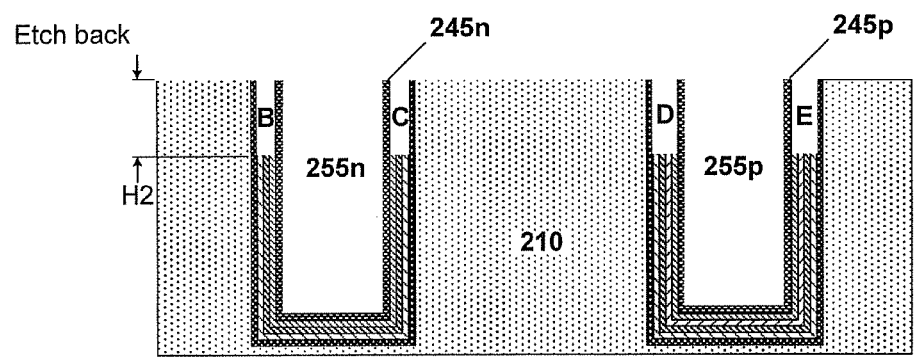
FIG. 20 is a block diagram illustrating a non-limiting, exemplary embodiment of etching performed on a structure in the formation of a gate structure comprising an insulative portion.

FIG. 20 illustrates an etching operation being performed which removes portions of layers 225-240. The etching operation can be, in part, a metal etch back operation which removes respective portions of layers 225, 230 and 240 to form openings B and C at the nFET gate 112 region, and portions of layers 225, 230, 235, and 240 from recess 255p to form openings D and E at the pFET gate 214 region. In an exemplary, non-limiting embodiment, openings B, C, D and E are formed to a common depth H2.

Figure 21:
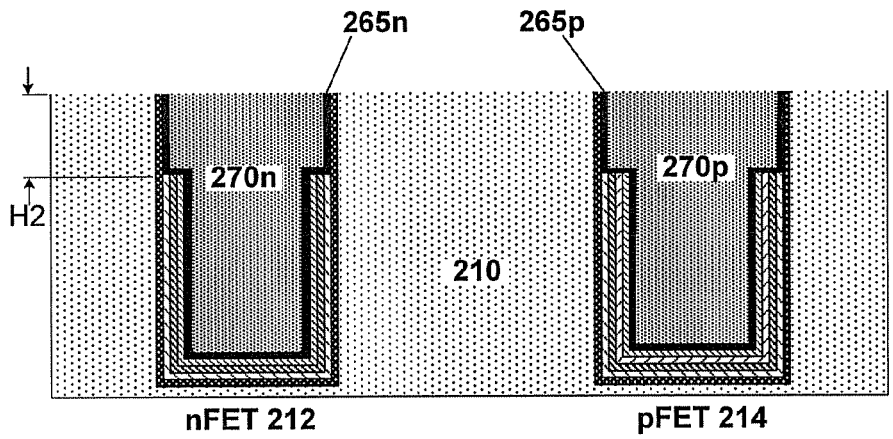
FIG. 21 is a block diagram illustrating a non-limiting, exemplary embodiment of forming a gate and liner layer in the formation of a gate structure comprising an insulative portion.

FIG. 21 illustrates formation of gate material in either of the nFET and/or pFET recesses. LTO layers 245n and 245p are removed with the T-shaped recesses lined with a layer of Ti, Ti layers 265n and 265p. Gate material (e.g., Al) is deposited to form gate material structures 270n and 270p. A CMP operation is performed to facilitate removal of excess Ti layer and/or gate material.

Figure 22:
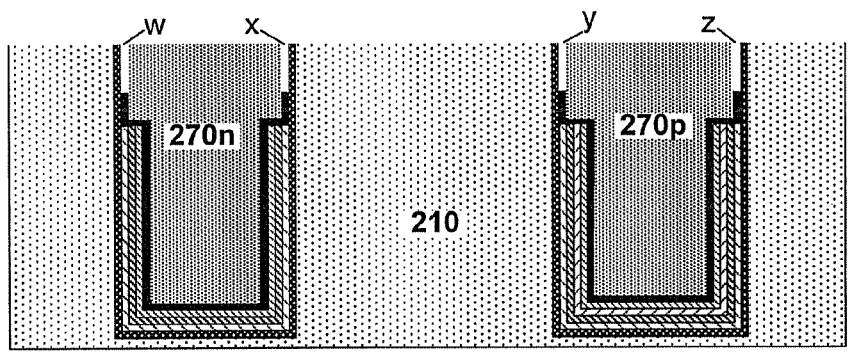
FIG. 22 is a block diagram illustrating a non-limiting, exemplary embodiment of etching a layer in the formation of a gate structure comprising an insulative portion.

FIG. 22 depicts an etching operation being performed to remove an amount of Ti layer to facilitate exposure of a portion of the respective sidewalls of gate structures 270n and 270p. The etching operation can be of any suitable technique (e.g., a wet etch) to facilitate removal of a required portion of Ti layers 265n and 265p to form respective openings w+x and y+z.

Figure 23:
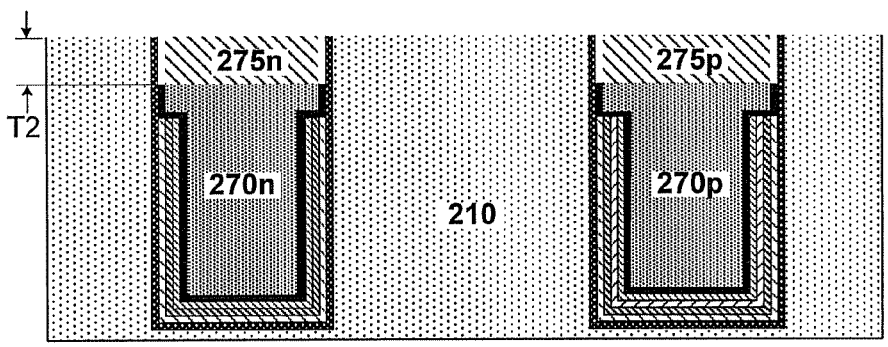
FIG. 23 is a block diagram illustrating a non-limiting, exemplary embodiment of modifying a gate material to form an insulating region in the formation of a gate structure comprising an insulative portion.

FIG. 23 illustrates a gate material modification process being performed. As previously mentioned, either of gate material structures 270n and 270p can be formed from any suitably conductive material such as aluminum. Selection of the gate material is made with consideration of the ability to modify a portion of the suitably conductive material to render the modified portion to have insulative properties and thus is no longer able to act as a pathway for flow of electrical current, etc. As depicted in FIG. 23, by having the sidewalls of the gate structures 270n and 270p exposed (per FIG. 22, openings w+x, y+z), the surface area of gate material exposed to the oxidizing atmosphere is such that the respective volume of chemically modified material (e.g., $Al_2O_3$) forming portions 275n and 275p is maximized compared with modifying flat profile material structures having no exposed sidewalls (ref. FIGS. 12-15 for further illustration of the concept). The depth of insulator forming structures 275n and 275p is controlled to a depth T2.

Figure 24:
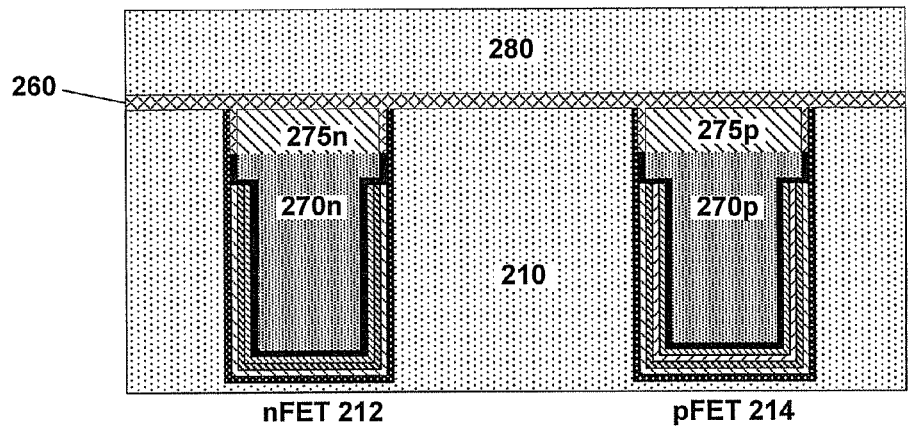
FIG. 24 is a block diagram illustrating a non-limiting, exemplary embodiment of capping the gate with an insulating layer and depositing an interlayer dielectric in the formation of a gate structure comprising an insulative portion.

FIG. 24 illustrates further construction of the gate structures. Insulator (e.g., nitride) is deposited on the structure to facilitate formation of a insulative capping layer, layer 260 which fills openings w+x, y+z. Further, an ILD layer 280 is formed on insulator layer 260.

Figure 25:
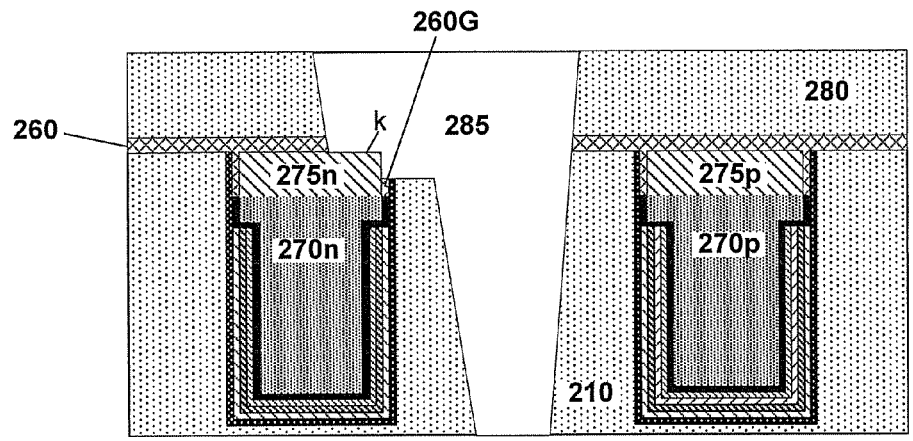
FIG. 25 is a block diagram illustrating a non-limiting, exemplary embodiment of forming a contact opening in the formation of a gate structure comprising an insulative portion.

FIG. 25 illustrates an opening 285 (e.g., a trench, via opening, etc.) being formed in the semiconductor structure. As illustrated, in this example, opening 285 is such that it exposes a surface portion k of insulating structure 275n. It is to be appreciated that opening 285 can equally be positioned to expose insulating structure 275p. Further, formation of opening 285 removes a portion of insulating layer 260 to create insulator portion 260G which compliments insulating structure 275n in further isolating gate 270n from opening 285.

Figure 26:
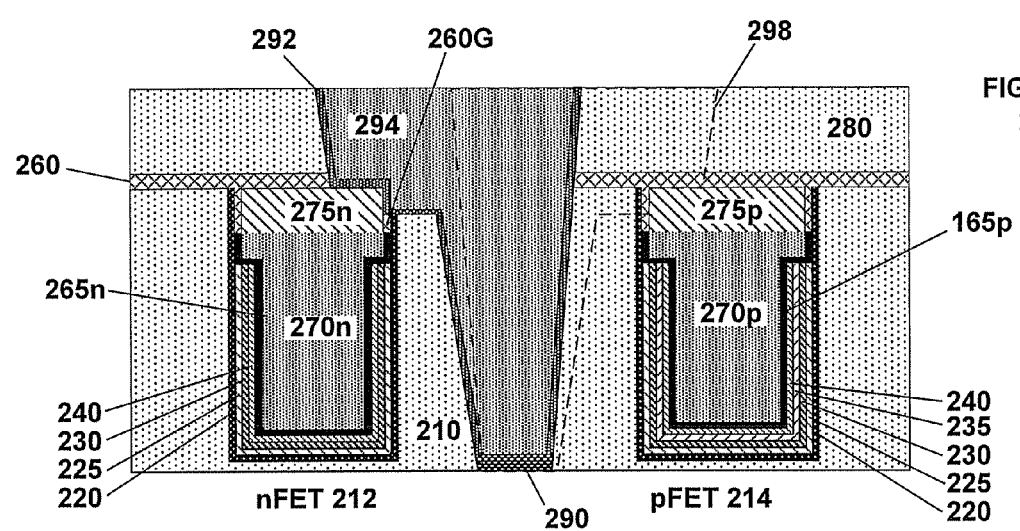
FIG. 26 is a block diagram illustrating a non-limiting, exemplary embodiment of forming a contact in the formation of a gate structure comprising an insulative portion.

FIG. 26 illustrates a final semiconductor structure according to an exemplary, non-limiting embodiment. A contact 290 is formed at the base of opening 285, where contact 290 can be formed from any suitable material and technique (e.g., NiSi). In an embodiment, a channel region (not shown) can be located beneath contact 290, wherein contact 290 is a region of silicide (e.g., trench silicide) formed at the bottom of the opening. The opening is then lined with any suitable material to form barrier layer 292, where the barrier material process of formation can be by any applicable technology as is known in the art. Finally, the remainder of opening 285 is filled with conductor 294 (e.g., tungsten (W)) as utilized with RMG technology and associated contact technology, such as a self aligned contact, as previously described.

As previously mentioned, it is to be appreciated that the gate structures are exemplary and provided to enable understanding of how a contact can be formed which is electrically isolated from a gate region. Hence, while FIG. 26 illustrates a contact is shown being formed in vicinity of nFET 212, the contact can be formed in a similar manner with reference to pFET 214, whereby gate insulating structure 275p can act to isolate gate 270p from a conductor, as depicted by broken line 298.

Figure 27:
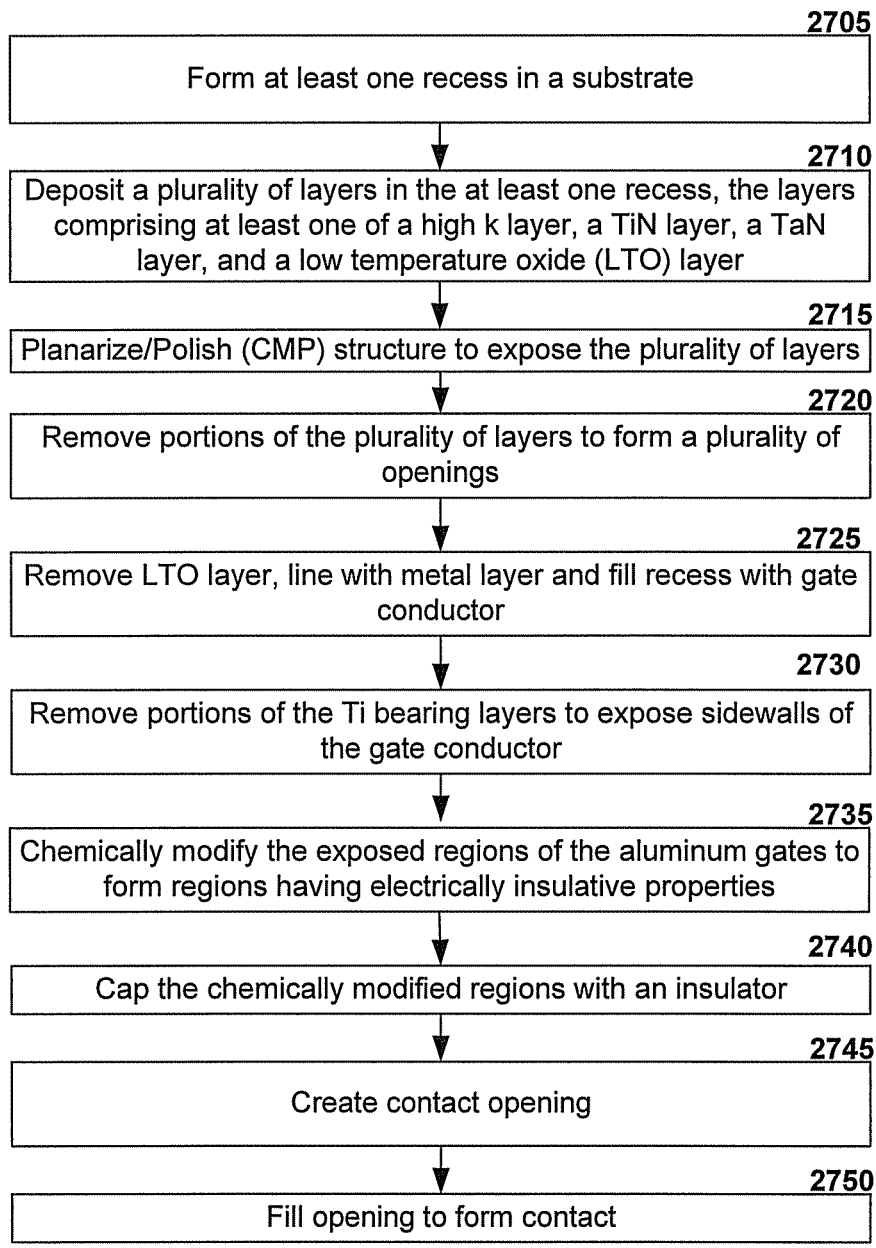
FIG. 27 illustrates a flow for forming a gate structure comprising an insulative portion in accordance with an exemplary, non-limiting embodiment.

FIG. 27 presents a flow diagram illustrating an exemplary, non-limiting embodiment to facilitate forming an RMG structure comprising a modified region in accordance with embodiments presented in FIGS. 18-26.

At 2705, an initial structure is formed, whereby one or more structures comprising a gate (e.g., a nFET gate, a pFET gate) are formed as part of a semiconductor component in a substrate (e.g., substrate 210). In an exemplary, non-limiting embodiment, at least one recess (e.g., 255n or 255p) is formed (e.g., by any suitable technique such as patterning) relative to a nFET gate region or a pFET gate region (e.g., nFET 212 or pFET 214).

At 2710, the at least one recess is subsequently lined with various layers (e.g., high k layer 220, TiN layer 225, TaN layer 230, TiN layer 235, TiAl layer 240, and/or a LTO layer 245) as required for formation and operation of the semiconductor device.

At 2715, a CMP operation is performed to facilitate formation of a recessed region (e.g., 255n or 255p) lined with the respective layers.

At 2720, an etching operation is performed to facilitate formation of openings. The openings (e.g., FIG. 20—B+C or D+E) can be formed as a result of an etch back operation removing portions of the deposited layers (e.g., layers 225, 230, 235 and/or 240). The openings can be formed to a common depth (e.g., FIG. 20, depth H2).

At 2725, the LTO layer (e.g., layer 245) is removed to facilitate the recess having a T-shaped profile. A metal containing layer (e.g., layer 265n or layer 265p) is deposited to line the T-shaped profile. The recess is subsequently filled with conductive material (e.g., aluminum) to form part of a gate structure (e.g., gate structure 270n or 270p). A CMP operation can be performed to remove and excess material (e.g., Ti or Al).

At 2730, a portion of the metal bearing layer (e.g., Ti layer 265n or 265p) is removed (e.g., by an etch back operation) to expose sidewalls of the gate structure (e.g., 270n or 270p) at the etched back openings (e.g., FIG. 22, openings w+x, y+z).

At 2735, the gate structure undergoes chemical modification to facilitate formation of a non-conductive region and a conductive region. In an exemplary, non-limiting embodiment, the gate structure is exposed to an oxidizing atmosphere to facilitate formation of an oxide region (e.g., region 275n or 275p) in conjunction with the remainder of the metallic region (e.g., region 270n or 270p). A portion of each original gate structure (e.g., region 270n or 270p) is chemically modified to an insulator material (e.g., region 275n or 275p).

At 2740, the chemically modified region is capped with insulator (e.g., layer 260) to fill the openings (e.g., FIG. 22, openings w+x, y+z) to facilitate encapsulation of the top and sidewalls of the modified region (e.g., 275n or 275p). Further layers (e.g., ILD layer 280) can be formed on the insulator layer.

At 2745, an opening is formed in the layered structure (e.g., layers 280, 260, 210) for a contact. The opening can be positioned such that the modified region (e.g., 275n or 275p) is exposed. Further the opening can cause removal of the insulator layer such that a portion (e.g., FIG. 25, portion 260G) remains to further isolate the underlying gate (e.g., material 270n).

At 2750, a series of operations are undertaken to facilitate formation of a first contact (e.g., a trench silicide 290) at the bottom of the opening to facilitate electrical connection with a layer located at the bottom of the opening (e.g., a channel), a layer lining the opening (e.g., barrier layer 292) and subsequently filled with conductor (e.g.; connector 294).

Process Variation #2 for Formation of a RMG Comprising an Isolation Region

A second variation for facilitating formation of an RMG structure comprising a modified region to facilitate electrical isolation of the RMG structure from a contact in the vicinity thereof is shown in FIGS. 28-36. In summary, the exemplary, non-limiting embodiments presented in FIGS. 28-36 comprise protecting a first gate structure while a second gate structure undergoes chemical modification.

Figure 28:
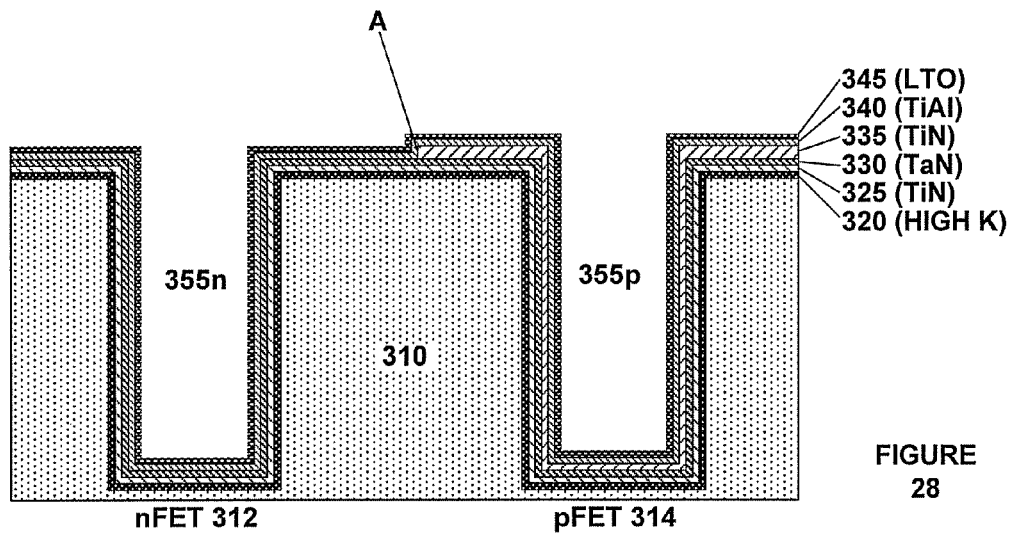
FIG. 28 is a block diagram illustrating a non-limiting, exemplary embodiment of an initial structure in the formation of a gate structure comprising an insulative portion.

FIG. 28 illustrates an initial structure for subsequent processing for formation of a gate incorporating a modified region facilitating isolation of the gate from other components. The initial structure of FIG. 28 comprises a substrate 310 (e.g., a substrate comprising Si, Si-compound, etc.), which has been patterned (by any suitable process) to form either of recesses 355n or 355p with respect to nFET gate 312 and pFET gate 314 regions. A plurality of work function layers associated with the respective nFET gate 312 and pFET gate 314 are formed thereon. A high K layer 320, a TiN layer 325, and a TaN layer 330 are sequentially formed on the nFET gate 312 and pFET gate 314 regions. A second TiN layer 335 is further deposited in the pFET 314 gate region, followed by formation of a TiAl layer 340, and a low temperature oxide (LTO) layer 345 over both of the nFET gate 312 and pFET gate 314 regions.

Figure 29:
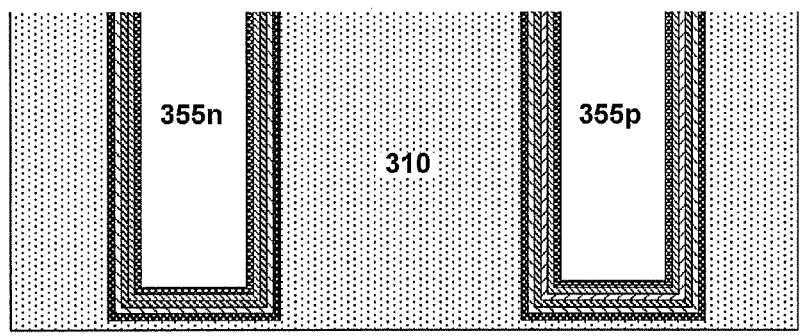
FIG. 29 is a block diagram illustrating a non-limiting, exemplary embodiment of CMP performed on a structure in the formation of a gate structure comprising an insulative portion.

As illustrated in FIG. 29, a CMP operation is performed. The CMP operation removes the upper horizontal portions of layers 320, 325, 330, 335, 340, and 345, to leave portions of the respective layers lining the recesses 355n and 355p.

Figure 30:
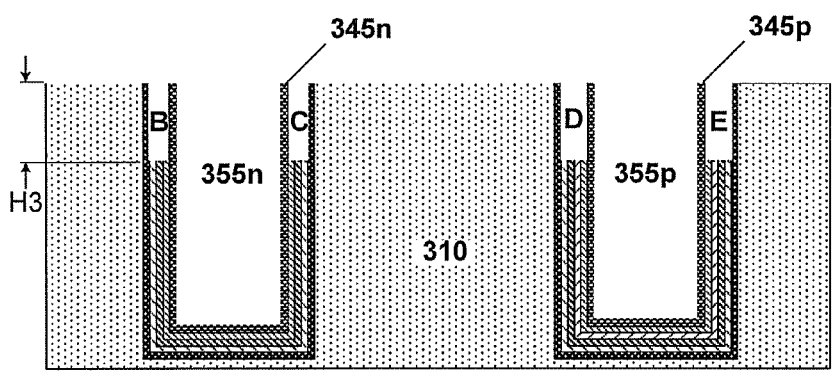
FIG. 30 is a block diagram illustrating a non-limiting, exemplary embodiment of etching performed on a structure in the formation of a gate structure comprising an insulative portion.

FIG. 30 illustrates an etching operation being performed which removes portions of layers 325-340. The etching operation can be, in part, a metal etch back operation which removes respective portions of layers 325, 330 and 340 to form openings B and C at the nFET gate 312 region, and portions of layers 325, 330, 335, and 340 from recess 355p to form openings D and E at the pFET gate 314 region. In an exemplary, non-limiting embodiment, openings B, C, D and E are formed to a common depth H3.

Figure 31:
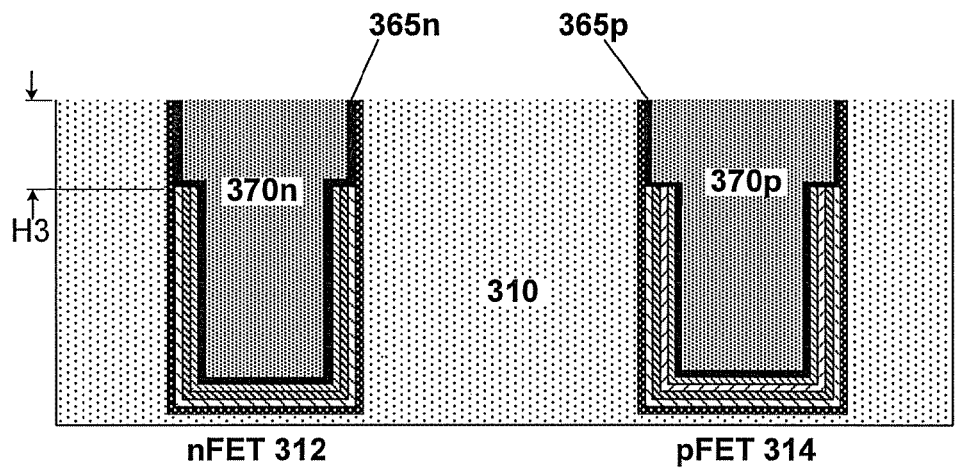
FIG. 31 is a block diagram illustrating a non-limiting, exemplary embodiment of forming a gate and liner layer in the formation of a gate structure comprising an insulative portion.

FIG. 31 illustrates formation of gate material in the nFET and pFET recesses. LTO layers 345n and 345p are removed with the T-shaped recesses lined with a layer of Ti, Ti layers 365n and 365p. Gate material (e.g., Al) is deposited to form gate material structures 370n and 370p. A CMP operation is performed to facilitate removal of excess Ti layer and/or gate material.

Figure 32:
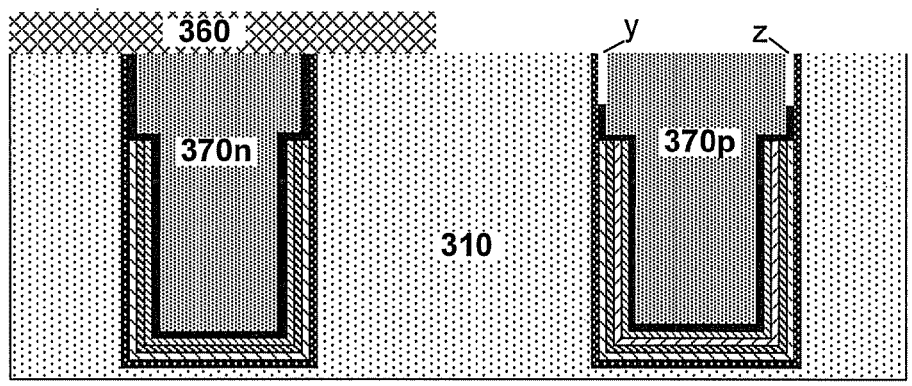
FIG. 32 is a block diagram illustrating a non-limiting, exemplary embodiment protecting a gate during etching of a layer in the formation of a gate structure comprising an insulative portion.

FIG. 32 depicts protection of one gate, gate 370n, and an etching operation being performed to remove an amount of Ti layer to facilitate exposure of a portion of the respective sidewalls of gate material structure 370p. Gate 370n is protected from the etching operation by utilizing any suitable technique, e.g., application of a nitride layer 360. In another embodiment, protection can be provide by a resist layer. The etching operation of 365p can be of any suitable technique (e.g., a wet etch) to facilitate removal of a required portion of Ti layer 365p to form respective openings y and z.

Figure 33:
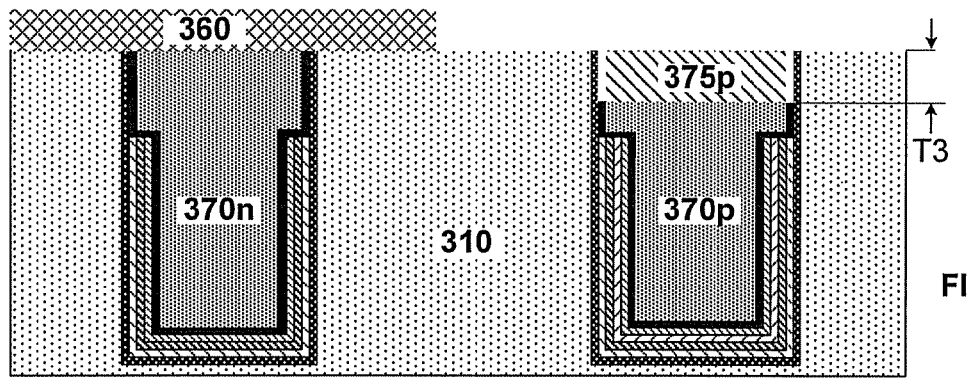
FIG. 33 is a block diagram illustrating a non-limiting, exemplary embodiment of modifying a gate material to form an insulating region in the formation of a gate structure comprising an insulative portion.

FIG. 33 illustrates a gate material modification process being performed. As previously mentioned, gate material structure 370p can be formed from any suitably conductive material, such as aluminum. As depicted in FIG. 33, by having the sidewalls of the gate structure 370p exposed (per FIG. 32, openings y and z), the surface area of gate material exposed to the oxidizing atmosphere is such that the respective volume of chemically modified material (e.g., $Al_2O_3$) forming portion 375p is maximized compared with modifying flat profile material structures having no exposed sidewalls (ref. FIGS. 12-15 for further illustration of the concept). The depth of insulator forming structure 375p is controlled to a depth T3.

Figure 34:
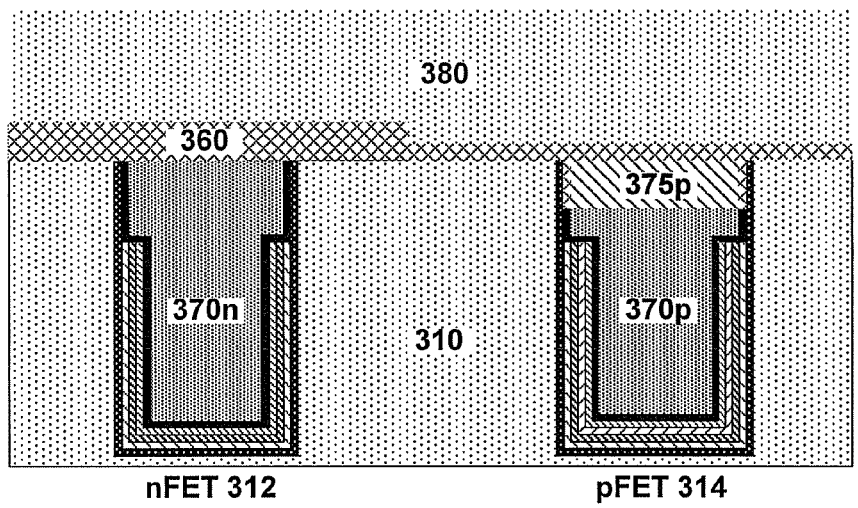
FIG. 34 is a block diagram illustrating a non-limiting, exemplary embodiment of capping the gate with an insulating layer and depositing an interlayer dielectric in the formation of a gate structure comprising an insulative portion.

FIG. 34 illustrates further construction of the gate structures. Further insulator (e.g., nitride) is deposited on the structure to facilitate extension of layer 360 to be a insulative capping layer which further fills openings y and z. Further, an ILD layer 380 is formed on insulator layer 360.

Figure 35:
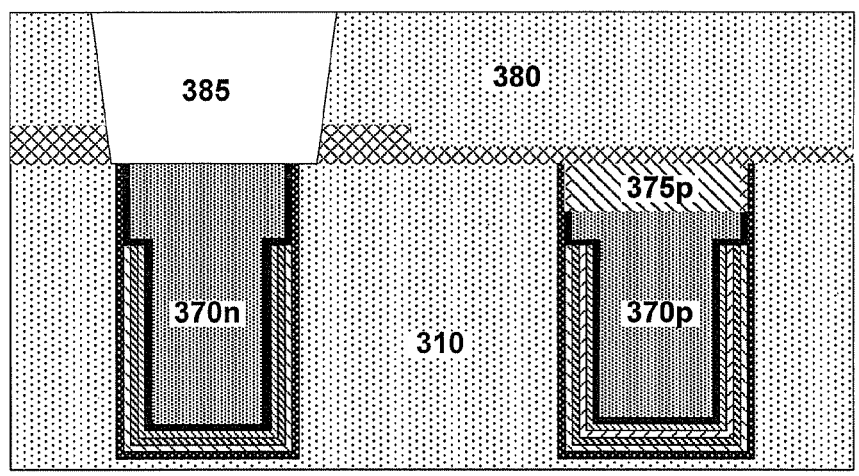
FIG. 35 is a block diagram illustrating a non-limiting, exemplary embodiment of forming a contact opening in the formation of a gate structure comprising an insulative portion.

FIG. 35 illustrates an opening 385 (e.g., a trench, via opening, etc.) being formed in the semiconductor structure. As illustrated, in this example, opening 385 is positioned to contact with gate material 370n.

Figure 36:
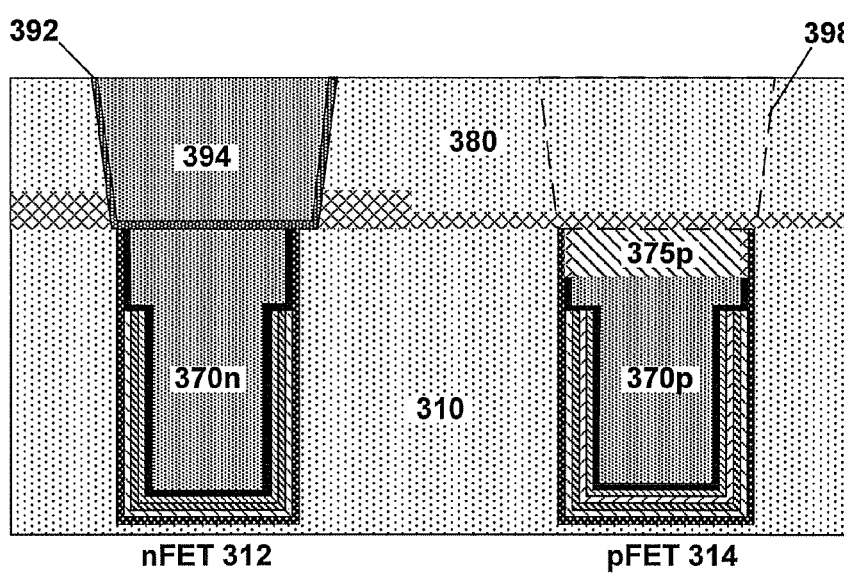
FIG. 36 is a block diagram illustrating a non-limiting, exemplary embodiment of forming a contact in the formation of a gate structure comprising an insulative portion.

FIG. 36 illustrates a final semiconductor structure according to an exemplary, non-limiting embodiment. The opening is lined with any suitable material to form barrier layer 392, where the barrier material can process of formation can be by any applicable technology as is known in the art. Finally, the remainder of opening 385 is filled with conductor 394 (e.g., tungsten (W)) as utilized with RMG technology and associated contact technology, such as a self aligned contact, as previously described.

As previously mentioned, it is to be appreciated that the gate structures are exemplary and provided to enable understanding of how a contact can be formed which is electrically isolated from a gate region. Hence, while FIG. 36 illustrates a contact 394 being formed in vicinity of nFET 312, the contact can be formed in a similar manner with reference to pFET 314, whereby gate insulating structure 375p can act to isolate gate 370p from a conductor, as depicted by broken line 398.

Figure 37:
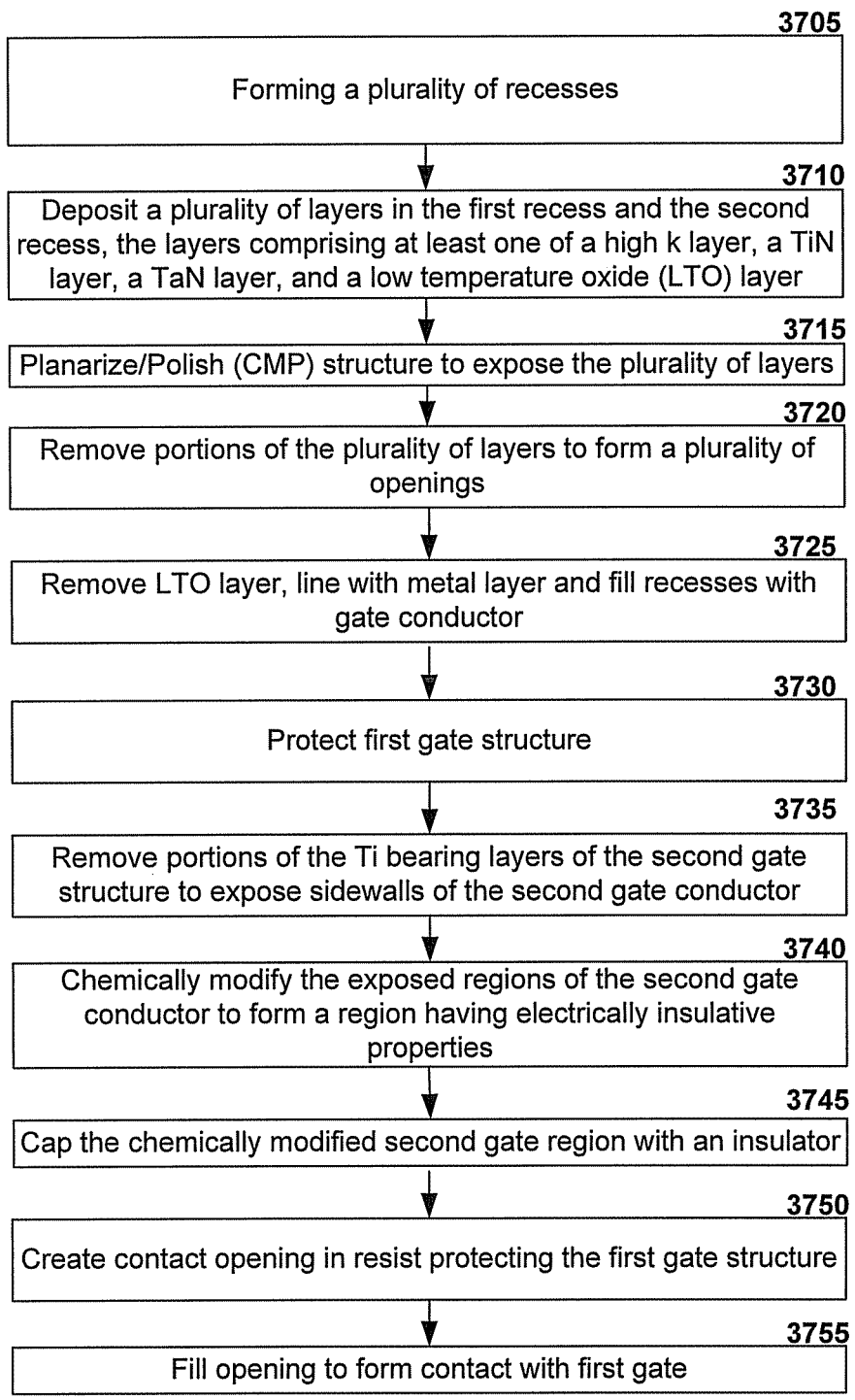
FIG. 37 illustrates a flow for forming a gate structure comprising an insulative portion in accordance with an exemplary, non-limiting embodiment.

FIG. 37 presents a flow diagram illustrating an exemplary, non-limiting embodiment to facilitate forming an RMG structure comprising a modified region in accordance with embodiments presented in FIGS. 28-36. In the exemplary, non-limiting embodiments, a first gate structure undergoes chemical modification while a second gate structure remains comprised entirely of conductive material.

At 3705, an initial structure is formed, whereby one or more structures comprising a gate (e.g., a nFET gate, a pFET gate) are formed as part of a semiconductor component in a substrate (e.g., substrate 310). In an exemplary, non-limiting embodiment, a recess (e.g., 355n or 355p) is formed (e.g., by any suitable technique such as patterning) relative to a nFET gate region or a pFET gate region (e.g., nFET 312 or pFET 314).

At 3710, the recess is subsequently lined with various layers (e.g., high k layer 320, TiN layer 325, TaN layer 330, TiN layer 335, TiAl layer 340, and/or a LTO layer 345) as required for formation and operation of the semiconductor device.

At 3715, a CMP operation is performed to facilitate formation of the recessed region (e.g., 355n or 355p) lined with the respective layers.

At 3720, an etching operation is performed to facilitate formation of a plurality of openings. The openings (e.g., FIG. 30—B+C, D+E) can be formed as a result of an etch back operation removing portions of the deposited layers (e.g., layers 325, 330, 335 and/or 340). The openings can be formed to a common depth (e.g., FIG. 30, depth H3).

At 3725, the LTO layer (e.g., layer 345n or 345p) is removed to facilitate the recesses having a T-shaped profile. A metal containing layer (e.g., layer 365n or 365p) is deposited to line the T-shaped profile. The recess is subsequently filled with conductive material (e.g., aluminum) to form part of a gate structure (e.g., gate structure 370n or gate structure 370p). A CMP operation can be performed to remove and excess material (e.g., Ti or Al).

At 3730, the recess is protected by a covering layer (e.g., layer 360, a nitride insulating layer), thereby enabling processing operations to be performed on the second gate structure without affecting the first gate structure. Hence, in an exemplary non-limiting embodiment, one gate structure undergoes chemical modification while another gate structure remains to be comprised entirely of conductive material.

At 3735, portions of the metal bearing layers (e.g., Ti layers 365*p*) are removed (e.g., by an etch back operation) to expose sidewalls of the second gate structure (e.g., 370*p*) at the etched back openings (e.g., FIG. 32, openings y and z).

At 3740, the second gate structure undergoes chemical modification to facilitate formation of a non-conductive region (e.g., region 375*p*) and a conductive region (e.g., region 370*p*). In an exemplary, non-limiting embodiment, the second gate structure is exposed to an oxidizing atmosphere to facilitate formation of an oxide region (e.g., region 375*p*) in conjunction with the remainder of the metallic region (e.g., region 370*n*).

At 3745, the chemically modified region of the second gate structure is capped with insulator (e.g., layer 360 is extended to cover region 375*p*) to fill the openings (e.g., FIG. 33, openings y and z) to facilitate encapsulation of the top and sidewalls of the modified region (e.g., region 375*p*). Further layers (e.g., ILD layer 380) can be formed on the insulator layer.

At 3750, an opening (e.g., opening 385) is formed in the layered structure (e.g., layers 380, 360, 310) for a contact to be connected with the first gate structure.

At 3755, a series of operations are undertaken to facilitate formation of a layer lining the opening (e.g., barrier layer 392) and subsequently filled with conductor (e.g., connector 394).

Process Variation #3 for Formation of a RMG Comprising an Isolation Region

A third variation for facilitating formation of an RMG structure comprising a modified region to facilitate electrical isolation of the RMG structure from a contact in the vicinity thereof is shown in FIGS. 38-47. In summary, the exemplary, non-limiting embodiments presented in FIGS. 38-47 comprise forming a contact opening in a semiconductor device and chemically modifying a gate structure exposed by the contact opening.

Figure 38:
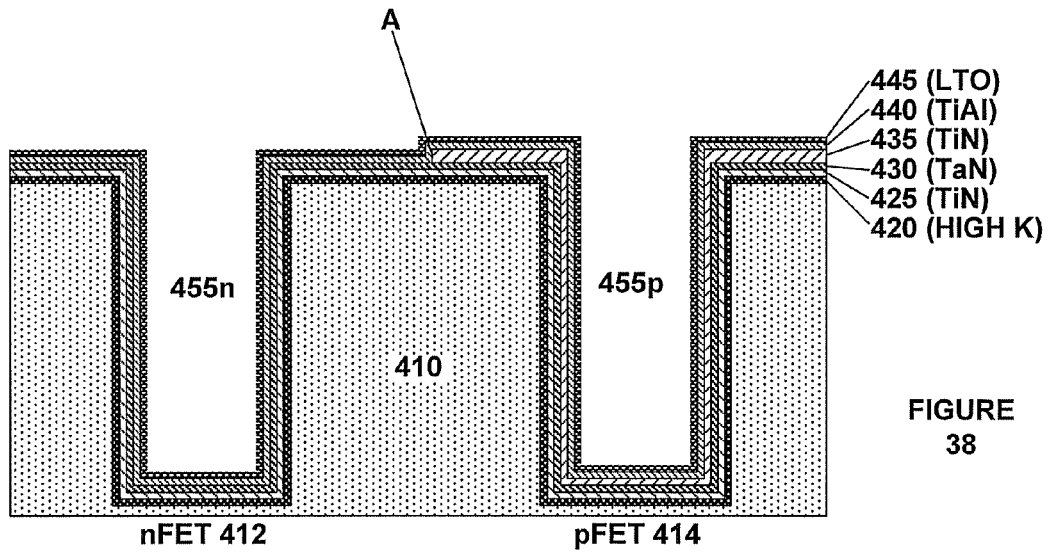
FIG. 38 is a block diagram illustrating a non-limiting, exemplary embodiment of an initial structure in the formation of a gate structure comprising an insulative portion.

FIG. 38 illustrates an initial structure for subsequent processing for formation of a gate incorporating a modified region facilitating isolation of the gate from other components. The initial structure of FIG. 38 comprises a substrate 410 (e.g., a substrate comprising Si, Si-compound, etc.), which has been patterned (by any suitable process) to form a recess, either 455*n* and 455*p* relative to the nFET gate 412 and pFET gate 414 regions. A plurality of work function layers associated with the respective nFET gate 412 and pFET gate 414 are formed thereon. A high K layer 420, a TiN layer 425, and a TaN layer 430 are sequentially formed on the nFET gate 412 and pFET gate 414 regions. A second TiN layer 435 is further deposited in the pFET 414 gate region, followed by formation of a TiAl layer 440, and a low temperature oxide (LTO) layer 445 over both of the nFET gate 412 and pFET gate 414 regions.

Figure 39:
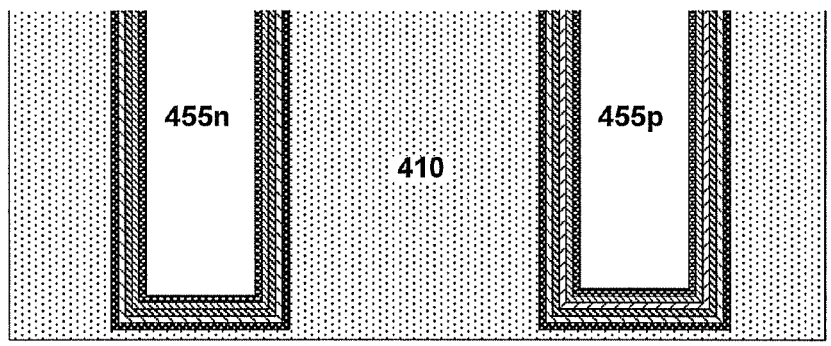
FIG. 39 is a block diagram illustrating a non-limiting, exemplary embodiment of CMP performed on a structure in the formation of a gate structure comprising an insulative portion.

As illustrated in FIG. 39, a CMP operation is performed. The CMP operation removes the upper horizontal portions of layers 420, 425, 430, 435, 440, and 445, to leave portions of the respective layers lining the recesses 455*n* and 455*p*.

Figure 40:
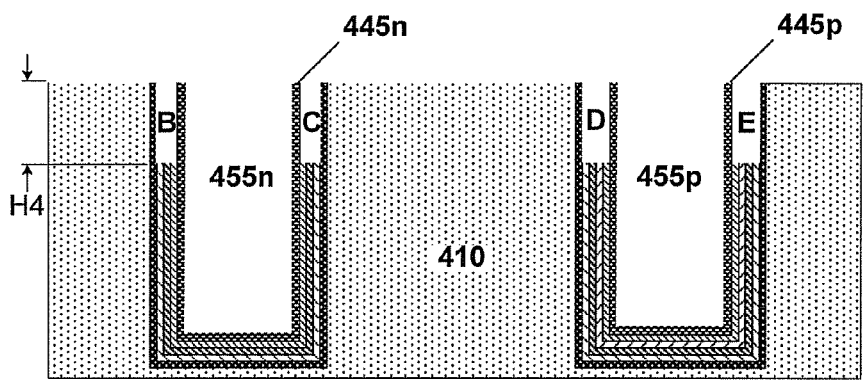
FIG. 40 is a block diagram illustrating a non-limiting, exemplary embodiment of etching performed on a structure in the formation of a gate structure comprising an insulative portion.

FIG. 40 illustrates an etching operation being performed which removes portions of layers 425-440. The etching operation can be, in part, a metal etch back operation which removes respective portions of layers 425, 430 and 440 to form openings B and C at the nFET gate 412 region, and portions of layers 425, 430, 435, and 440 from recess 455*p* to form openings D and E at the pFET gate 414 region. In an exemplary, non-limiting embodiment, openings B, C, D and E are formed to a common depth H4.

Figure 41:
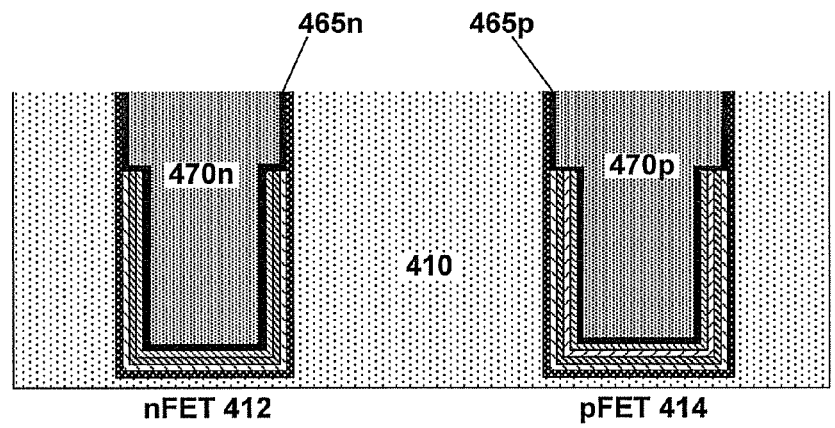
FIG. 41 is a block diagram illustrating a non-limiting, exemplary embodiment of forming a gate and liner layer in the formation of a gate structure comprising an insulative portion.

FIG. 41 illustrates formation of gate material in the nFET and pFET recesses. LTO layers 445*n* and 445*p* are removed with the T-shaped recesses lined with a layer of Ti, Ti layers 465*n* and 465*p*. Gate material (e.g., Al) is deposited to form the respective gate material structures 470*n* and 470*p*. A CMP operation is performed to facilitate removal of excess Ti layer and/or gate material.

Figure 42:
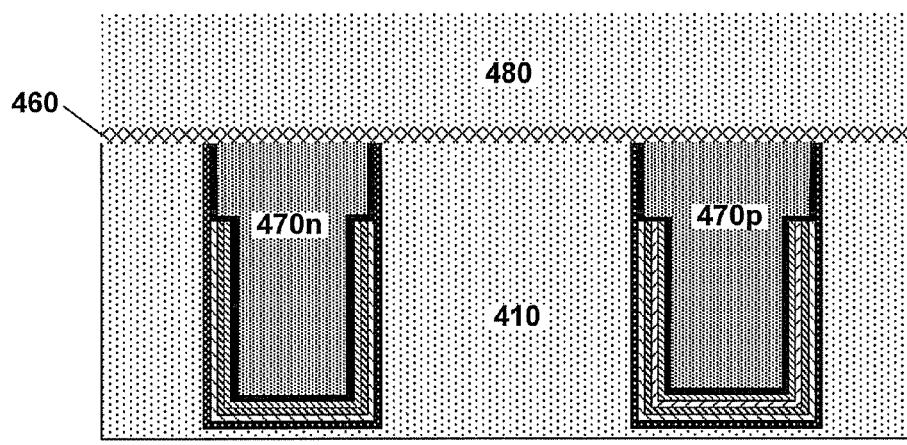
FIG. 42 is a block diagram illustrating a non-limiting, exemplary embodiment of capping the gate with an insulating layer and depositing an interlayer dielectric in the formation of a gate structure comprising an insulative portion.

FIG. 42 depicts illustrates further construction of the gate structures. Insulator (e.g., nitride) is deposited on the structure to form layer 460 and further, an ILD layer 480 is formed on insulator layer 460.

Figure 43:
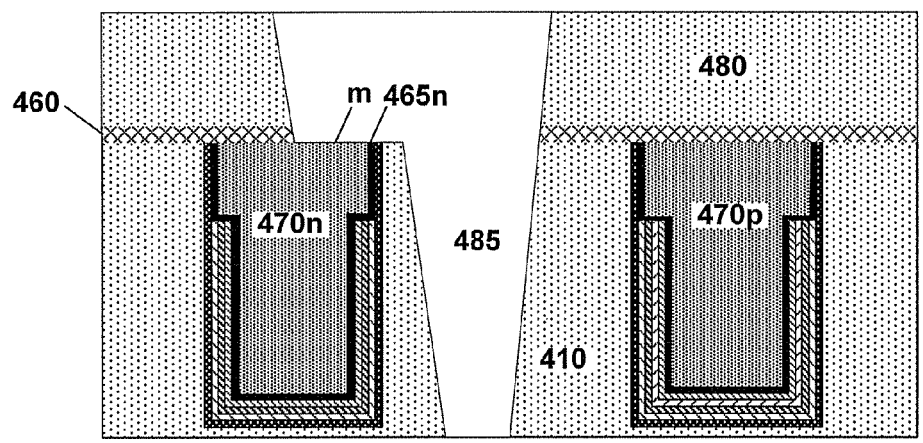
FIG. 43 is a block diagram illustrating a non-limiting, exemplary embodiment of forming a contact opening in the formation of a gate structure comprising an insulative portion.

FIG. 43 illustrates an opening 485 (e.g., a trench, via opening, etc.) being formed in the semiconductor structure. As illustrated, in this example, opening 485 is such that it exposes a surface portion m of gate structure 470*n* and also an end portion of layer 465*n*. It is to be appreciated that opening 485 can equally be positioned to expose insulating structure 475*p*.

Figure 44:
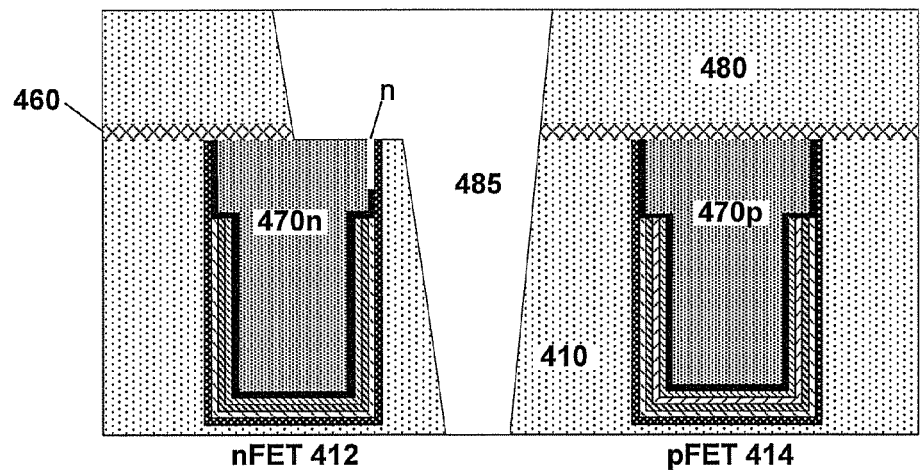
FIG. 44 is a block diagram illustrating a non-limiting, exemplary embodiment of etching a layer in the formation of a gate structure comprising an insulative portion.

FIG. 44 illustrates an etching operation being performed to remove an amount of Ti layer 465*n* to facilitate exposure of a portion n of the sidewall of gate material structure 470*n*.

Figure 45:
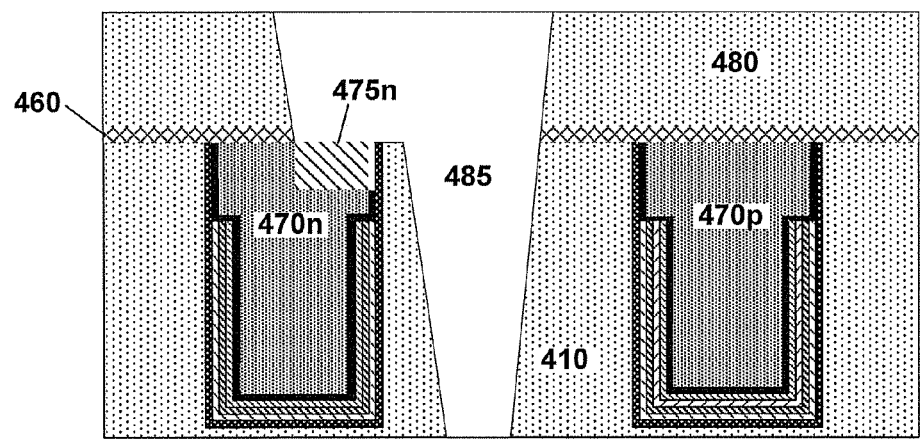
FIG. 45 is a block diagram illustrating a non-limiting, exemplary embodiment of modifying a gate material to form an insulating region in the formation of a gate structure comprising an insulative portion.

FIG. 45 illustrates a gate material modification process being performed. As previously mentioned, gate material structures 470*n* and 470*p* can be formed from any suitably conductive material, such as aluminum.

Figure 46:
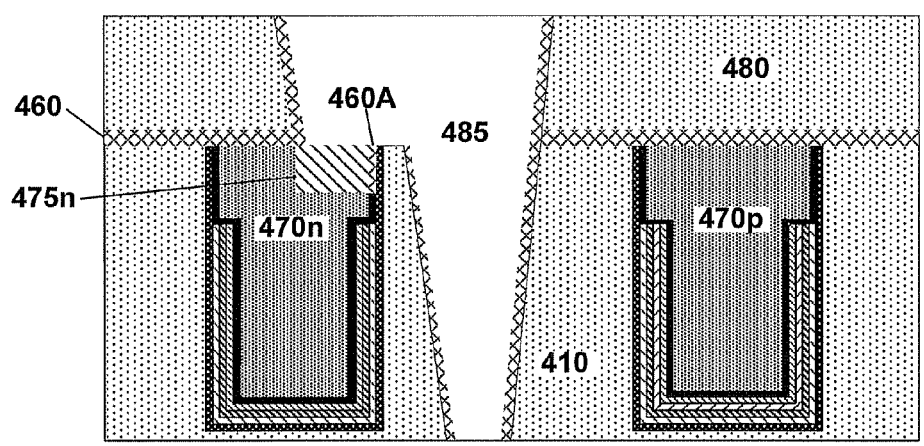
FIG. 46 is a block diagram illustrating a non-limiting, exemplary embodiment of depositing further insulating layer in the formation of a gate structure comprising an insulative portion.

FIG. 46 illustrates further construction of the gate structures. Further insulator (e.g., nitride) is deposited on the structure to facilitate extension of layer 460 to further line opening 485 as well as filling opening n with material 460A.

Figure 47:
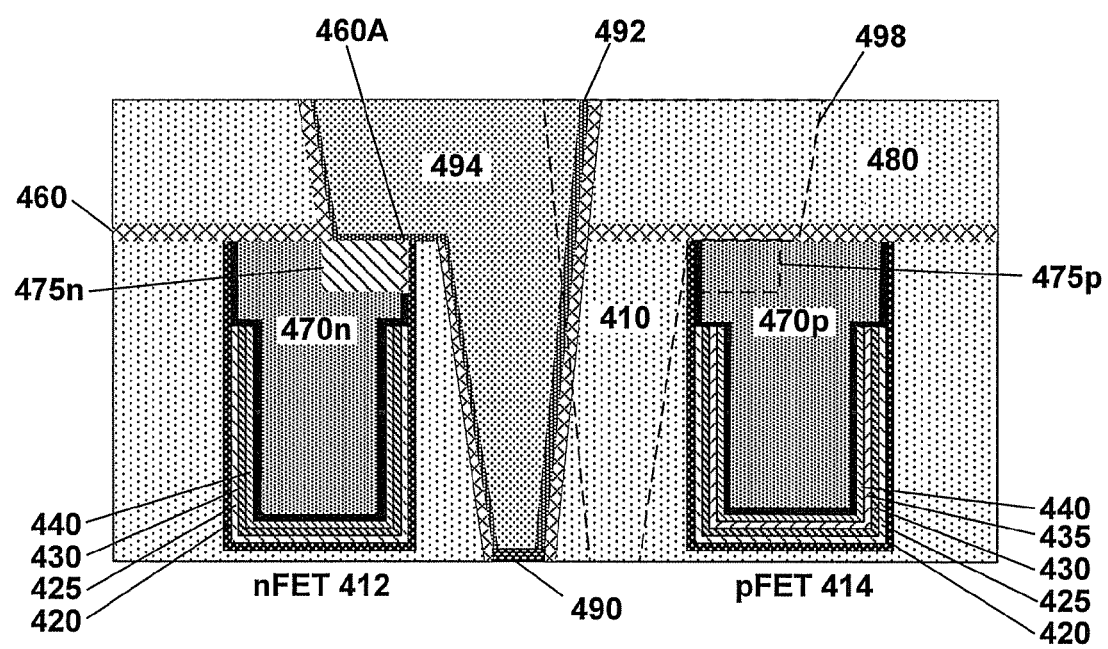
FIG. 47 is a block diagram illustrating a non-limiting, exemplary embodiment of forming a contact in the formation of a gate structure comprising an insulative portion.

FIG. 47 illustrates a final semiconductor structure according to an exemplary, non-limiting embodiment. A contact 490 is formed at the base of opening 485, where contact 490 can be formed from any suitable material and technique (e.g., a nickel silicide, NiSi). In an embodiment, a channel region (not shown) can be located beneath contact 490, wherein contact 490 is a region of silicide (e.g., trench silicide) formed at the bottom of the opening. The remainder of opening 485 is filled with a barrier layer 492 and with conductor 494 (e.g., tungsten (W)) as utilized with RMG technology and associated contact technology, such as a self aligned contact, as previously described. As previously mentioned, it is to be appreciated that the gate structures are exemplary and provided to enable understanding of how a contact can be formed which is electrically isolated from a gate region. Hence, while FIG. 47 illustrates a contact 494 being formed in vicinity of nFET 412, the contact can be formed in a similar manner with reference to pFET 414, whereby gate insulating structure 475*p* can act to isolate gate 470*p* from a conductor, as depicted by broken line 498.

Figure 48:
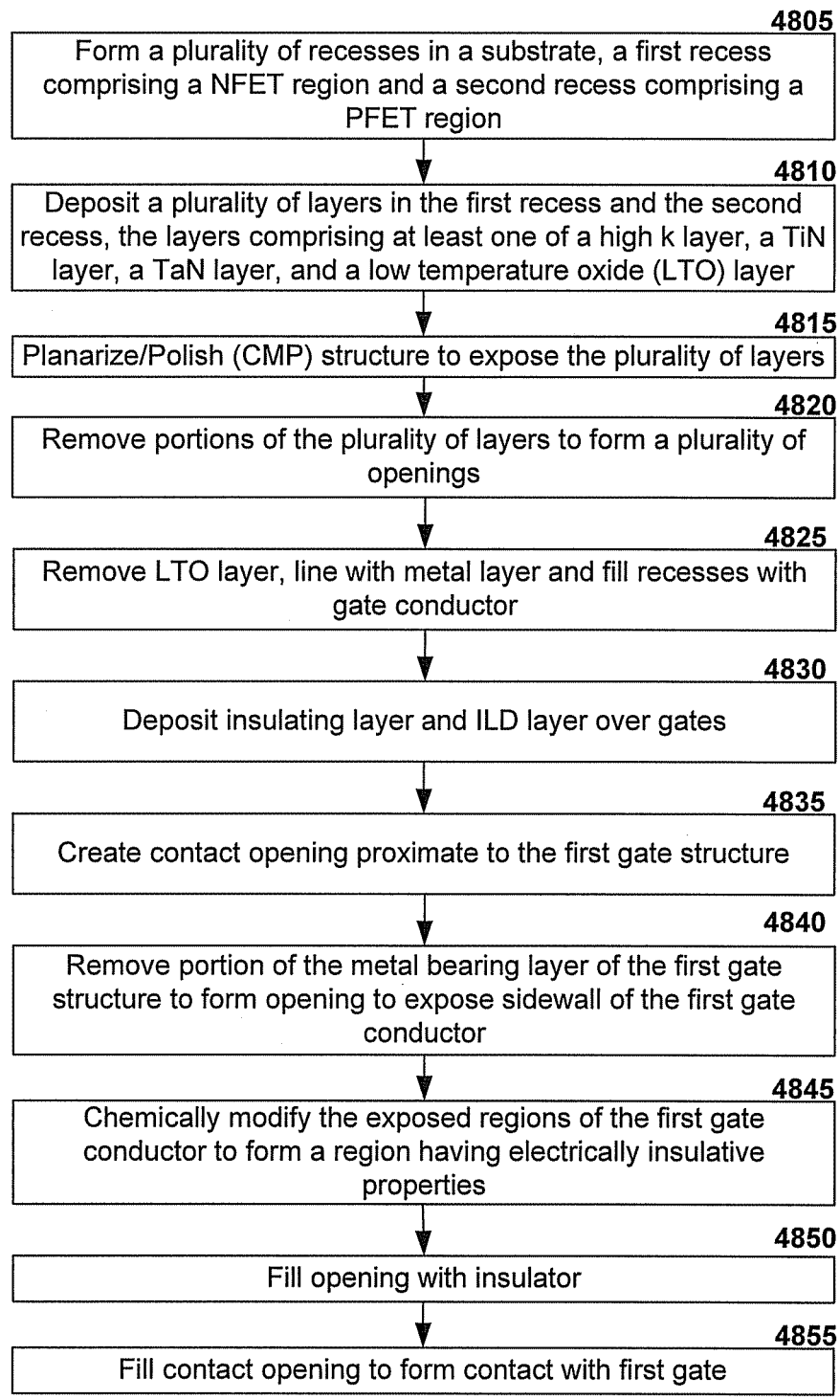
FIG. 48 illustrates a flow for forming a gate structure comprising an insulative portion in accordance with an exemplary, non-limiting embodiment.

FIG. 48 presents a flow diagram illustrating an exemplary, non-limiting embodiment to facilitate forming an RMG structure comprising a modified region in accordance with embodiments presented in FIGS. 28-36. The exemplary, non-limiting embodiments, comprise forming a contact opening in a semiconductor device and chemically modifying a gate structure exposed by the contact opening.

At 4805, an initial structure is formed, whereby one or more structures comprising a gate (e.g., a nFET gate, a pFET gate) are formed as part of a semiconductor component in a substrate (e.g., substrate 410). In an exemplary, non-limiting embodiment, a first recess (e.g., 455*n*) and/or a second recess (e.g., 455*p*) are formed (e.g., by any suitable technique such as patterning) relative to a nFET gate region and a pFET gate region (e.g., nFET 412 and pFET 414).

At 4810, the recess is subsequently lined with various layers (e.g., high k layer 420, TiN layer 425, TaN layer 430, TiN layer 435, TiAl layer 440, and/or a LTO layer 445) as required for formation and operation of the semiconductor device.

At 4815, a CMP operation is performed to facilitate formation of the recessed regions (e.g., 355n or 355p) lined with the respective layers.

At 4820, an etching operation is performed to facilitate formation of a plurality of openings. The openings (e.g., FIG. 40—openings B+C, D+E) can be formed as a result of an etch back operation removing portions of the deposited layers (e.g., layers 425, 430, 435 and/or 440). The openings can be formed to a common depth (e.g., FIG. 40, depth H4).

At 4825, the LTO layer (e.g., layer 445n or 445p) is removed to facilitate the recesses having a T-shaped profile. A metal containing layer (e.g., layer 465n or 465p) are deposited to line the T-shaped profile. The recess is subsequently filled with conductive material (e.g., aluminum) to form part of a gate structure (e.g., first gate structure 470n or second gate structure 470p). A CMP operation can be performed to remove and excess material (e.g., Ti or Al).

At 4830, an insulator layer (e.g., layer 260, a nitride) is deposited over the gate structure, with a further ILD layer (e.g., ILD layer 280) formed on the insulator layer.

At 4835, an opening (e.g., opening 485) is formed in the layered structure (e.g., layers 480, 460, 410) in the region of the first gate structure.

At 4840, a portion of the metal containing layer (e.g., layer 465n) is removed (e.g., by an etch back operation) to form an opening n to expose sidewalls of the first gate structure (e.g., 470n) that has been exposed by the opening formed in the layered structure.

At 4845, the exposed portion of the first gate structure undergoes chemical modification to facilitate formation of a non-conductive region (e.g., region 475n) and a conductive region (e.g., region 470n). In an exemplary, non-limiting embodiment, the first gate structure is exposed to an oxidizing atmosphere to facilitate formation of an oxide region (e.g., region 475p) in conjunction with the remainder of the metallic region (e.g., region 470n).

At 4850, the opening (e.g., opening n) is filled with insulator material (e.g., region 460A, a nitride) along with nitride layers being formed on the inside surfaces of the contact opening.

At 4855, a series of operations are undertaken to facilitate formation of a first contact (e.g., a trench silicide 490) at the bottom of the opening to facilitate electrical connection with a layer located at the bottom of the opening, a layer lining the opening (e.g., barrier layer 492) and subsequently filled with conductor (e.g., connector 494).

General Considerations

Throughout the description, the term substrate is indicated to be the base layer upon which the various subsequent layers, nFET and pFET, resists, gate structures, etc., are formed. The substrate can comprise of any suitable material, such as Si, Si-compound, etc., which can be subsequently doped to form respective nFET and pFET regions, etc.

The various layers (e.g., layers 120, 125, 130, 135, 140, 145, etc.) can be formed/deposited by any suitable process such as a CVD process, for example, low pressure chemical vapor deposition (LPCVD), plasma enhanced chemical vapor deposition (PECVD), etc.

Any suitable technique can be used to pattern any of the material layers presented herein, (e.g., to form the nFET 112 and pFET 114 recesses in substrate 110). For example, patterning can be created by employing a photoresist which is patterned using standard photolithographic techniques to form the required pattern to create the pattern, trenches, openings, etc., wherein the photoresist is exposed to electromagnetic radiation through a mask having an image pattern of a desired layout (e.g., desired trenches, openings, line patterning, etc.). Openings are then formed in the photoresist in order to form the desired layout, e.g., by etching away the exposed material (in the case of a positive photoresist) or etching away the unexposed material (in the case of a negative photoresist). Depending on the material of the photoresist, exposure can create a positive or a negative. With a positive photoresist, exposure causes a chemical change in the photoresist such that the portions of the photoresist layer exposed to light become soluble in a developer. With a negative photoresist, the chemical change induced by exposure renders the exposed portions of the photoresist layer insoluble to the developer. After exposure and develop, a layout according to the desired pattern is laid out on the first layer. A subsequent processing step, such as an etching step or an ion implantation step, can be performed and controlled according to the layout. For instance, after exposure and develop, material in the first layer not covered by the photoresist layer can be etched, thus transferring the pattern to the first layer. The photoresist can be subsequently removed. Etching can be by any viable dry or wet etching technique. For example, a wet or dry etching technique can be employed for patterning, while in another aspect, etching can be by a specific anisotropically etch.

Any etching/material removal technique is applicable to the various embodiments, as described herein. Wet etching can be utilized to remove a particular layer (e.g., any of layers 125, 130, 135, 140, 165n, 165p, etc.) where a given layer may be susceptible to etch by a particular etchant while a neighboring layer is not (e.g., selective etching utilized to remove portions w, x, y, z from Ti layers 165n and 165p). In another example, anisotropic etching techniques can be utilized to control material removal in a specific direction (unlike standard wet etching) such as vertically down into a stack to form an opening, etc.

Levelling of layers after formation can be by any suitable technique, e.g., by chemical mechanical polish/planarization (CMP) or other suitable process, to achieve a given dimension, in preparation for the next stage in creation of the replacement gate/contact structure, etc.

Stripping of a resist layer (e.g., resists 150, 150n, 150p, etc) involves the removal of unwanted resist from the semiconductor stack, while preventing removal of underlying layers and materials. Any suitable stripper can be utilized as required, such as organic stripper, inorganic stripper, dry stripping, etc.

It is to be appreciated that while the formation of gate structures comprising an insulative region is described, there may be certain procedures that are not fully disclosed during description of the various embodiments as presented herein. However, rather than provide description of each and every operation involved in the various operations facilitating formation, patterning, removal, etc., of each structure presented herein, for the sake of description only the general operations are described. Hence, while no mention may be presented regarding a particular operation pertaining to aspects of a particular figure, it is to be appreciated that any necessary operation, while either not fully disclosed, or not mentioned, to facilitate formation/deconstruction of a particular layer/element/aspect presented in a particular figure is considered to have been conducted. For example, while no mention may be made regarding a layer described in a preceding figure being leveled (e.g., by chemical mechanical polish, or other suitable operation) it is considered, for the sake of readability of the various exemplary embodiments presented herein, that the leveling process occurred, as have any other necessary operations. It is appreciated that the various operations, e.g., leveling, chemical mechanical polish, patterning, photolithography, deposition, layer formation, etching, etc., are well known procedures and are not necessarily expanded upon throughout this description.

The claimed subject matter has been described with reference to the drawings, wherein like reference numerals are used to refer to like elements throughout. In the description, for purposes of explanation, numerous specific details are set forth in order to provide a thorough understanding of the claimed subject matter. It may be evident, however, that the claimed subject matter may be practiced without these specific details. In other instances, well-known structures and devices may be shown in block diagram form in order to facilitate describing the claimed subject matter.

It is to be appreciated that the various Figures illustrating the various embodiments presented herein are simply rendered to facilitate understanding of the various embodiments. Accordingly, the various embodiments can be applicable to respective elements of any dimension, scaling, area, volume, distance, etc., and while a Figure may illustrate a dimension of one element rendered in association with another element, the respective dimensions, scaling, ratios, etc., are not limited to those as rendered but can be of any applicable magnitude.

What has been described above includes examples of the disclosed innovation. It is, of course, not possible to describe every conceivable combination of components or methodologies for purposes of describing the disclosed innovation, but one of ordinary skill in the art can recognize that many further combinations and permutations of the disclosed innovation are possible. Accordingly, the disclosed innovation is intended to embrace all such alterations, modifications and variations that fall within the spirit and scope of the appended claims. Furthermore, to the extent that the term "contain," "includes," "has," "involve," or variants thereof is used in either the detailed description or the claims, such term can be inclusive in a manner similar to the term "comprising" as "comprising" is interpreted when employed as a transitional word in a claim. The word "exemplary" is used herein to mean serving as an example, instance, or illustration. For the avoidance of doubt, the subject matter disclosed herein is not limited by such examples. In addition, any aspect or design described herein as "exemplary" is not necessarily to be construed as preferred or advantageous over other aspects or designs, nor is it meant to preclude equivalent exemplary structures and techniques known to those of ordinary skill in the art.

With respect to any figure or numerical range for a given characteristic, a figure or a parameter from one range may be combined with another figure or a parameter from a different range for the same characteristic to generate a numerical range.

Other than in the operating examples, or where otherwise indicated, all numbers, values and/or expressions referring to quantities of ingredients, reaction conditions, etc., used in the specification and claims are to be understood as modified in all instances by the term "about."

Further, while certain embodiments have been described above, it is to be appreciated that these embodiments have been presented by way of example only, and are not intended to limit the scope of the claimed subject matter. Indeed, the novel methods and devices described herein may be made without departing from the spirit of the above description. The accompanying claims and their equivalents are intended to cover such forms or modifications as would fall within the scope and spirit of the subject innovation.

In addition, it should be appreciated that while the respective methodologies provided above are shown and described as a series of acts for purposes of simplicity, such methodologies are not limited by the order of acts, as some acts can, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

What is claimed is:

1. A semiconductor structure, comprising:
   a gate, further comprising:
   a first portion of the gate comprising a conductive material; and
   a second portion of the gate consisting of a non-conductive material, the second portion being on a top surface of the first portion and covering a whole of the top surface of the first portion;
   a conductive layer directly formed on a side wall of the first portion of the gate except a side wall of an upper portion of the first portion of the gate, and directly formed on a bottom of the first portion of the gate; and
   an insulator layer directly formed on the side wall of the upper portion of the first portion of the gate and directly formed on a side wall of the second portion of the gate, on one of a first side and a second side of the second portion, the second side being opposite to the first side.

2. The semiconductor of claim 1, wherein the conductive material is a metal.

3. The semiconductor of claim 2, wherein the metal is aluminum.

4. The semiconductor of claim 3, wherein the second portion of the gate is aluminum oxide.

5. The semiconductor of claim 1, wherein the insulator is in direct contact with the side wall of the upper portion of the first portion of the gate, the conductor layer, and the second portion of the gate.

6. The semiconductor of claim 1, further comprising a connector proximate to the gate, and wherein the second portion of the gate and the insulator layer act to electrically isolate the first portion of the gate from the connector.

7. The semiconductor of claim 6, wherein the insulator layer has an opening and the second portion of the gate electrically isolate the first portion of the gate from the connector at the opening.

8. The semiconductor of claim 1, wherein the insulator layer includes a first insulator and a second insulator, the first insulator being directly formed on the side wall of the upper portion of the first portion of the gate and directly formed on the side wall of the second portion of the gate, on the one of the first side and the second side, and the second insulator being directly formed on a side wall of the upper portion of the first portion of the gate and directly formed on a side wall of the second portion of the gate, on an other side of the first side and the second side.

9. The semiconductor of claim 8, wherein a connector is formed in a contact opening, the connector contacts at least one of the first insulator, the second insulator, and the second portion of the gate.

10. The semiconductor of claim 9, wherein the first insulator is in direct contact with the side wall of the upper portion of the first portion of the gate, the conductive layer and the second portion of the gate.

* * * * *